United States Patent
Miyazaki et al.

(10) Patent No.: US 11,611,367 B2
(45) Date of Patent: *Mar. 21, 2023

(54) RADIO-FREQUENCY MODULE AND COMMUNICATION DEVICE

(71) Applicant: Murata Manufacturing Co., Ltd., Nagaokakyo (JP)

(72) Inventors: Daisuke Miyazaki, Nagaokakyo (JP); Hidemori Akagi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 84 days.

This patent is subject to a terminal disclaimer.

(21) Appl. No.: 17/313,002

(22) Filed: May 6, 2021

(65) Prior Publication Data
US 2021/0391886 A1    Dec. 16, 2021

(30) Foreign Application Priority Data
Jun. 10, 2020    (JP) .............................. JP2020-101197

(51) Int. Cl.
| | |
|---|---|
| *H04B 1/40* | (2015.01) |
| *H03F 3/24* | (2006.01) |
| *H03F 1/56* | (2006.01) |
| *H04B 1/06* | (2006.01) |

(52) U.S. Cl.
CPC ............ *H04B 1/40* (2013.01); *H03F 1/56* (2013.01); *H03F 3/245* (2013.01); *H04B 1/06* (2013.01); *H03F 2200/222* (2013.01); *H03F 2200/294* (2013.01); *H03F 2200/451* (2013.01)

(58) Field of Classification Search
CPC ................. H03F 1/56; H03F 2200/111; H03F 2200/222; H03F 2200/294; H03F 2200/451; H03F 2203/7209; H03F 3/195; H03F 3/245; H03F 3/72; H04B 1/06; H04B 1/40
See application file for complete search history.

(56) References Cited

U.S. PATENT DOCUMENTS

| | | | |
|---|---|---|---|
| 11,290,144 B2* | 3/2022 | Yoshida | H04B 1/006 |
| 2019/0067220 A1* | 2/2019 | Wan | H01Q 1/2283 |
| 2019/0181809 A1* | 6/2019 | Wallis | H03F 3/72 |

FOREIGN PATENT DOCUMENTS

JP        2013-529435 A      7/2013

* cited by examiner

*Primary Examiner* — David S Huang
(74) *Attorney, Agent, or Firm* — Xsensus LLP

(57) ABSTRACT

A radio-frequency module includes a mount board, an antenna terminal and a ground terminal, a low-noise amplifier, a first inductor, and a second inductor. The mount board has a first principal surface and a second principal surface on opposite sides of the mount board from one another. The low-noise amplifier includes a transistor configured to amplify a signal. The first inductor is disposed on one of the first principal surface and the second principal surface of the mount board. The first inductor is connected to the antenna terminal. The second inductor is disposed on the other of the first principal surface and the second principal surface of the mount board. The second inductor is connected between the transistor and the ground terminal.

20 Claims, 10 Drawing Sheets

RADIO-FREQUENCY MODULE AND COMMUNICATION DEVICE

CROSS REFERENCE TO RELATED APPLICATION

The present application claims priority to Japanese patent application JP2020-101197, filed Jun. 10, 2020, the entire contents of which being incorporated herein by reference.

BACKGROUND

1. Field

The present disclosure generally relates to a radio-frequency module and a communication device, and particularly relates to a radio-frequency module including a mount board and a communication device including the radio-frequency module.

2. Description of the Related Art

U.S. Patent Application Publication No. 2019/181809 discloses a front-end system that includes an antenna, a multi-throw switch, and a low-noise amplifier.

The low-noise amplifier includes an impedance transformation circuit and an amplification circuit. The impedance transformation circuit includes a first inductor and a second inductor. The amplification circuit includes a field-effect transistor. The input of the low-noise amplifier is electrically connected to the antenna by way of the multi-throw switch.

The amplification circuit is configured to receive a radio-frequency (RF) signal by way of a series inductor and the first inductor. The second inductor is magnetically coupled to the first inductor. The second inductor is connected between a terminal of the field-effect transistor and the ground.

SUMMARY

When a radio-frequency module includes, for example, an impedance matching inductor connected to an antenna terminal, it has often been desired that the noise figure (NF) of a low-noise amplifier be reduced.

The present disclosure provides a radio-frequency module and a communication device that can reduce the noise figure of a low-noise amplifier.

A radio-frequency module according to embodiments of the present disclosure includes a mount board, an antenna terminal and a ground terminal, a low-noise amplifier, a first inductor, and a second inductor. The mount board has a first principal surface and a second principal surface on opposite sides of the mount board from one another. The low-noise amplifier includes a transistor configured to amplify a signal. The first inductor is disposed on one of the first principal surface and the second principal surface of the mount board. The first inductor is connected to the antenna terminal. The second inductor is disposed on the other of the first principal surface and the second principal surface of the mount board. The second inductor is connected between the transistor and the ground terminal, A communication device according to embodiments of the present disclosure includes the radio-frequency module described above and a signal processing circuit. The signal processing circuit is connected to the radio-frequency module and configured to process a radio-frequency signal.

The radio-frequency module and the communication device according to the embodiments of the present disclosure can reduce the noise figure of the low-noise amplifier.

Other features, elements, characteristics, and advantages of the present disclosure will become more apparent from the following detailed description of embodiments of the present disclosure with reference to the attached drawings.

DESCRIPTION OF THE EMBODIMENTS

Figure 1:
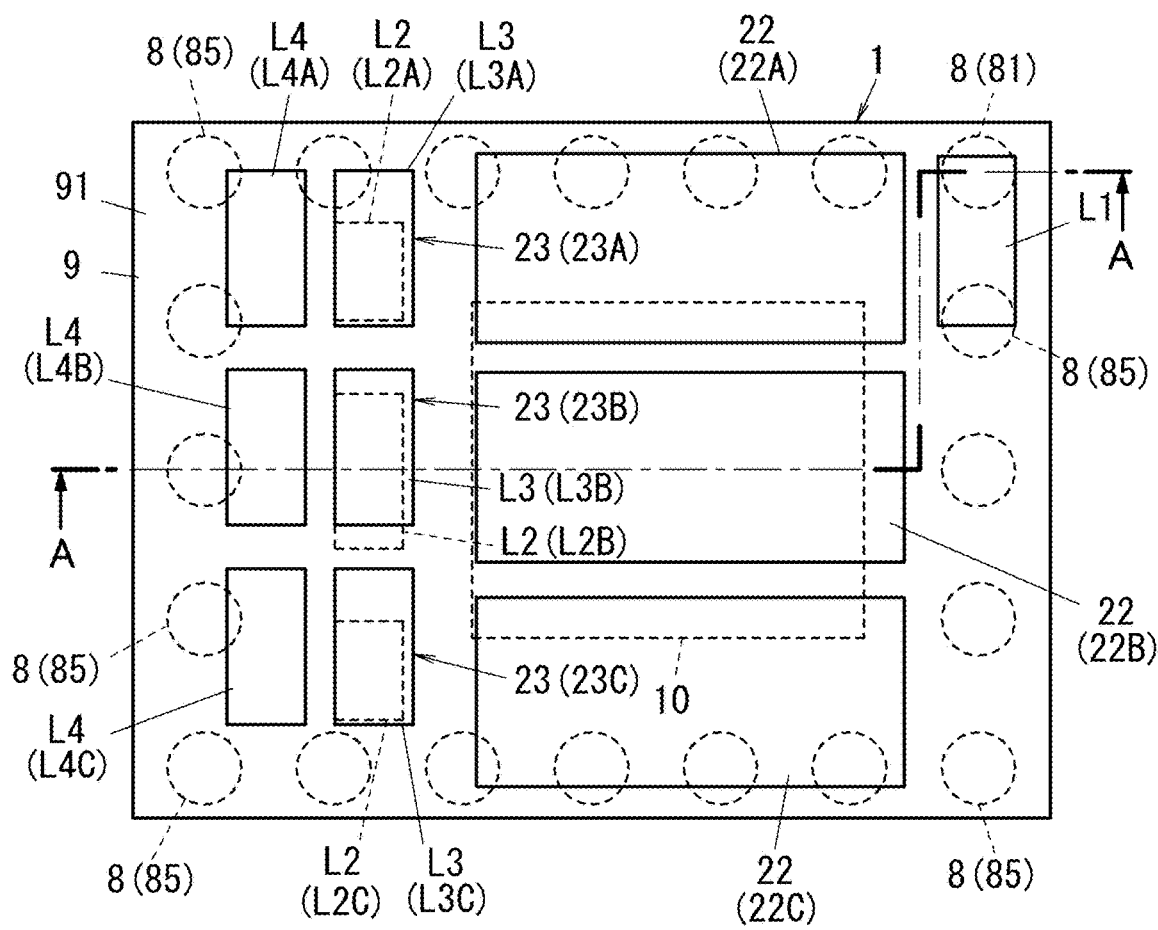
FIG. 1 is a plan view of a radio-frequency module according to a first embodiment.

FIGS. 1 to 3 and FIGS. 6 to 12 that are referred to in the following embodiments are all schematic diagrams, in which the ratios of sizes and thicknesses of illustrated components do not necessarily reflect the actual dimensional ratios.

First Embodiment

As illustrated in FIGS. 1 to 4, a radio-frequency module 1 according to a first embodiment includes a mount board 9, an antenna terminal 81 and ground terminals 85, a plurality of (e.g., three) low-noise amplifiers 21, a first inductor L1, and a plurality of (e.g., three) second inductors L2. The mount board 9 has a first principal surface 91 and a second principal surface 92 opposite each other in a direction of thickness D1 of the mount board 9. The antenna terminal 81 and the ground terminals 85 are disposed on the mount board 9. The plurality of low-noise amplifiers 21, the first inductor L1, and the plurality of second inductors L2 are disposed on the mount board 9. The plurality of low-noise amplifiers 21 each include a transistor Tr (see FIG. 5) for amplification. The transistor Tr amplifies an input radio-frequency signal (reception signal) and outputs the amplified signal. The transistor Tr is, for example, a field-effect transistor (FET) having a gate terminal, a drain terminal, and a source terminal. The transistor Tr amplifies a radio-frequency signal input to the gate terminal, and outputs the amplified signal from the drain terminal. The first inductor L1 is connected to the antenna terminal 81. The first inductor L1 is included, for example, in a matching circuit (or matching network, MN) 3 (see FIGS. 4 and 5) between the antenna terminal 81 and a plurality of reception filters 22. In the radio-frequency module 1 according to the first embodiment, the matching circuit 3 is constituted by the first inductor L1 connected between the ground terminal 85 and a signal path between the antenna terminal 81 and a switch 4. The second inductor L2 is connected between the source terminal of the transistor Tr and the ground terminal 85. In the radio-frequency module 1 according to the first embodiment, the first inductor L1 is disposed on the first principal surface 91 of the mount board 9, whereas the plurality of second inductors L2 are disposed on the second principal surface 92 of the mount board 9. This arrangement of components and mount board can reduce the noise figure of each of the plurality of low-noise amplifiers 21 in the radio-frequency module 1 according to the first embodiment.

The radio-frequency module 1 and a communication device 300 according to the first embodiment will now be described in detail with reference to FIGS. 1 to 5.

(1) Radio-Frequency Module and Communication Device (1.1) Circuit Configuration of Radio-Frequency Module and Communication Device The radio-frequency module 1 according to the first embodiment is used, for example, for the communication device 300 (see FIG. 4) that supports multi-mode and multi-band. Examples of the communication device 300 include, but are not limited to, a mobile phone (e.g., smartphone). The communication device 300 may be, for example, a wearable terminal (e.g., smartwatch). The radio-frequency module 1 is a module that supports, for example, the fourth generation mobile communication (4G) standard or the fifth generation mobile communication (5G) standard. The 4G standard is, for example, the Third Generation Partnership Project (3GPP) Long-Term Evolution (LTE) standard. The 5G standard is, for example, the 5G New Radio (NR). The radio-frequency module 1 is a circuit that supports carrier aggregation and dual connectivity.

The radio-frequency module 1 is configured to amplify, for example, a reception signal (radio-frequency signal) received from an antenna 310 and output the amplified signal to a signal processing circuit 301. The signal processing circuit 301 is not a component of the radio-frequency module 1, but is a component of the communication device 300 including the radio-frequency module 1. The radio-frequency module 1 is controlled, for example, by the signal processing circuit 301 included in the communication device 300. The communication device 300 includes the radio-frequency module 1 and the signal processing circuit 301. The communication device 300 further includes the antenna 310. The communication device 300 further includes a circuit board having the radio-frequency module 1 mounted thereon. The circuit board is, for example, a printed wiring board. The circuit board has ground electrodes to which a ground potential is applied.

The signal processing circuit 301 includes, for example, an RF signal processing circuit 302 and a baseband signal processing circuit 303. The RF signal processing circuit 302 is, for example, a radio-frequency integrated circuit (RFIC) that processes a radio-frequency signal. For example, the RF signal processing circuit 302 performs signal processing, such as upconversion, on a radio-frequency signal (transmission signal) output from the baseband signal processing circuit 303 and outputs the processed radio-frequency signal. Also, for example, the RF signal processing circuit 302 performs signal processing, such as downconversion, on a radio-frequency signal (reception signal) output from the radio-frequency module 1 and outputs the processed radio-frequency signal to the baseband signal processing circuit 303. The baseband signal processing circuit 303 is, for example, a baseband integrated circuit (BBIC). The baseband signal processing circuit 303 generates an I-phase signal and a Q-phase signal from a baseband signal. Examples of the baseband signal include an audio signal and an image signal that are externally input. The baseband signal processing circuit 303 performs IQ modulation by combining the I-phase signal with the Q-phase signal to output a transmission signal. The transmission signal here is generated as a modulated signal (IQ signal) by modulating the amplitude of a carrier wave signal of a predetermined frequency with a period longer than the period of the carrier wave signal. The reception signal processed by the baseband signal processing circuit 303 is used, for example, as an image signal for image display or as an audio signal for phone calls. The radio-frequency module 1 according to the first embodiment transmits a radio-frequency signal (reception signal) between the antenna 310 and the RF signal processing circuit 302 of the signal processing circuit 301.

The radio-frequency module 1 includes the plurality of (e.g., three) low-noise amplifiers 21. The radio-frequency module 1 also includes a plurality of input matching circuits 23 connected one-to-one to the plurality of low-noise amplifiers 21. The radio-frequency module 1 further includes the plurality of reception filters 22 connected one-to-one to the plurality of low-noise amplifiers 21. The radio-frequency module 1 further includes the switch 4 (which may hereinafter be also referred to as antenna switch 4) connected between the antenna terminal 81 and the plurality of reception filters 22, a switch 6 (which may hereinafter be also referred to as band selection switch 6) connected between the plurality of reception filters 22 and the input terminals of the plurality of low-noise amplifiers 21, and a switch 19 (which may hereinafter be also referred to as band selection switch 19) connected between the output terminals of the plurality of low-noise amplifiers 21 and a signal output terminal 83.

The radio-frequency module 1 also includes a plurality of external connection terminals 8. The plurality of external connection terminals 8 include the antenna terminal 81, the signal output terminal 83, and the plurality of ground terminals 85 (see FIGS. 1 to 3). The plurality of ground terminals 85 are terminals which are electrically connected to the ground electrodes on the circuit board of the communication device 300 and to which a ground potential is applied.

The plurality of low-noise amplifiers 21 each have an input terminal and an output terminal. The plurality of low-noise amplifiers 21 each amplify a reception signal in a predetermined frequency band input to the input terminal and output the amplified signal from the output terminal. The input terminals of the plurality of low-noise amplifiers 21 are each connected to the band selection switch 6, with a corresponding one of the plurality of input matching circuits 23 interposed therebetween. The output terminals of the plurality of low-noise amplifiers 21 are connected to one signal output terminal 83, with the band selection switch 19 interposed therebetween. The output terminals of the plurality of low-noise amplifiers 21 are connected to the signal processing circuit 301, with, for example, the band selection switch 19 and the signal output terminal 83 interposed therebetween. The signal output terminal 83 is a terminal for outputting a radio-frequency signal (reception signal) from the plurality of low-noise amplifiers 21 to an external circuit (e.g., signal processing circuit 301).

The plurality of reception filters 22 are filters having different communication bands as pass bands. For distinction among the three reception filters 22, for example, a filter having a reception band of a first communication band as a pass band may hereinafter be referred to as a reception filter 22A, a filter having a reception band of a second communication band as a pass band may hereinafter be referred to as a reception filter 22B, and a filter having a reception band of a third communication band as a pass band may hereinafter be referred to as a reception filter 22C. For distinction among the plurality of low-noise amplifiers 21, the low-noise amplifier 21 connected to the reception filter 22A may hereinafter be referred to as a low-noise amplifier 21A, the low-noise amplifier 21 connected to the reception filter 22B may hereinafter be referred to as a low-noise amplifier 21B, and the low-noise amplifier 21 connected to the reception filter 22C may hereinafter be referred to as a low-noise amplifier 21C. For distinction among the plurality of input matching circuits 23, the input matching circuit 23 connected to the low-noise amplifier 21A may hereinafter be referred to as an input matching circuit 23A, the input matching circuit 23 connected to the low-noise amplifier 21B may hereinafter be referred to as an input matching circuit 23B, and the input matching circuit 23 connected to the low-noise amplifier 21C may hereinafter be referred to as an input matching circuit 23C.

The antenna switch 4 has a common terminal 40 and a plurality of (e.g., three) selection terminals 41 to 43. The common terminal 40 is connected to the antenna terminal 81, to which the antenna 310 is connected. The selection terminal 41 of the antenna switch 4 is connected to the input terminal of the reception filter 22A, the selection terminal 42 of the antenna switch 4 is connected to the input terminal of the reception filter 22B, and the selection terminal 43 of the antenna switch 4 is connected to the input terminal of the reception filter 22C. The antenna switch 4 is a switch capable of connecting, for example, at least one of the plurality of selection terminals 41 to 43 to the common terminal 40. The antenna switch 4 is a switch capable of enabling, for example, one-to-one and one-to-many connections.

The antenna switch 4 is controlled, for example, by the signal processing circuit 301. The antenna switch 4 switches the connection between the common terminal 40 and the plurality of selection terminals 41 to 43 in accordance with a control signal from the RF signal processing circuit 302 of the signal processing circuit 301. The antenna switch 4 is, for example, a switch integrated circuit (IC).

The band selection switch 6 includes a plurality of (e.g., three) switch elements 65 (65A, 65B, and 65C). In the band selection switch 6, the switch element 65A is connected between the reception filter 22A and the input matching circuit 23A, the switch element 65B is connected between the reception filter 22B and the input matching circuit 23B, and the switch element 65C is connected between the reception filter 22C and the input matching circuit 23C.

The band selection switch 6 is controlled, for example, by the signal processing circuit 301. The band selection switch 6 switches the state of each of the plurality of switch elements 65A to 65C in accordance with a control signal from the RF signal processing circuit 302 of the signal processing circuit 301. The band selection switch 6 is, for example, a switch IC.

The band selection switch 19 has a common terminal 190 and a plurality of (e.g., three) selection terminals 191 to 193. The common terminal 190 is connected to the signal output terminal 83. The selection terminal 191 is connected to the output terminal of the low-noise amplifier 21A, the selection terminal 192 is connected to the output terminal of the low-noise amplifier 21B, and the selection terminal 193 is connected to the output terminal of the low-noise amplifier 21C. The band selection switch 19 is a switch capable of connecting, for example, at least one of the plurality of selection terminals 191 to 193 to the common terminal 190. The band selection switch 19 is a switch capable of enabling, for example, one-to-one and one-to-many connections.

The band selection switch 19 is controlled, for example, by the signal processing circuit 301. The band selection switch 19 switches the connection between the common terminal 190 and the plurality of selection terminals 191 to 193 in accordance with a control signal from the RF signal processing circuit 302 of the signal processing circuit 301. The band selection switch 19 is, for example, a switch IC.

The input matching circuit 23A is disposed in a signal path between the input terminal of the low-noise amplifier 21A and the switch element 65A of the band selection switch 6. The input matching circuit 23B is disposed in a signal path between the input terminal of the low-noise amplifier 21B and the switch element 65B of the band selection switch 6. The input matching circuit 23C is disposed in a signal path between the input terminal of the low-noise amplifier 21C and the switch element 65C of the band selection switch 6.

Figure 5:
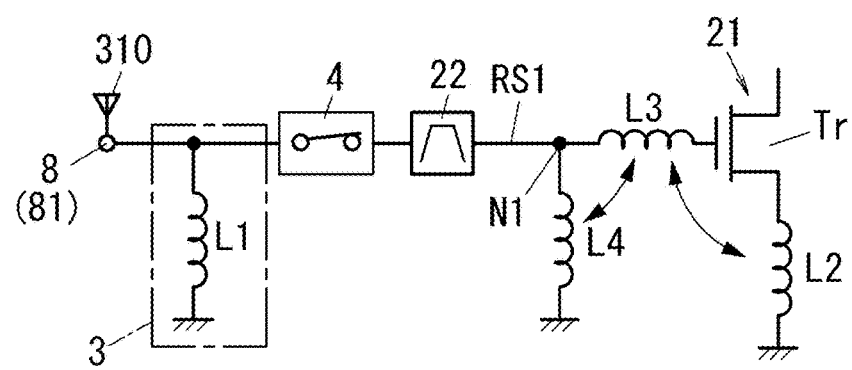
FIG. 5 is a circuit diagram of part of the radio-frequency module illustrated in FIG. 1.

The plurality of input matching circuits 23 each are a circuit for impedance matching between the low-noise amplifier 21 and the reception filter 22 corresponding to the input matching circuit 23. The plurality of input matching circuits 23 each include, as illustrated in FIG. 5, a third inductor L3 and a fourth inductor L4. The band selection switch 6 is not shown in FIG. 5. FIG. 5 schematically illustrates, with a graphic symbol representing a switch, the antenna switch 4 in which one of the three selection terminals 41 to 43 is connected to the common terminal 40. The third inductor L3 is connected in series to the low-noise amplifier 21. More specifically, the third inductor L3 is connected between the input terminal of the low-noise amplifier 21 (or the gate terminal of the transistor Tr) and the reception filter 22. The fourth inductor L4 is connected between the ground and a signal path RS1 between the third inductor L3 and the reception filter 22. In FIG. 5, an arrow pointing to both the second inductor L2 and the third inductor L3 schematically indicates that the second inductor L2 and the third inductor L3 are magnetically coupled. Similarly, in FIG. 5, an arrow pointing to both the third inductor L3 and the fourth inductor L4 schematically indicates that the third inductor L3 and the fourth inductor L4 are magnetically coupled.

(1.2) Structure of Radio-Frequency Module

Figure 2:
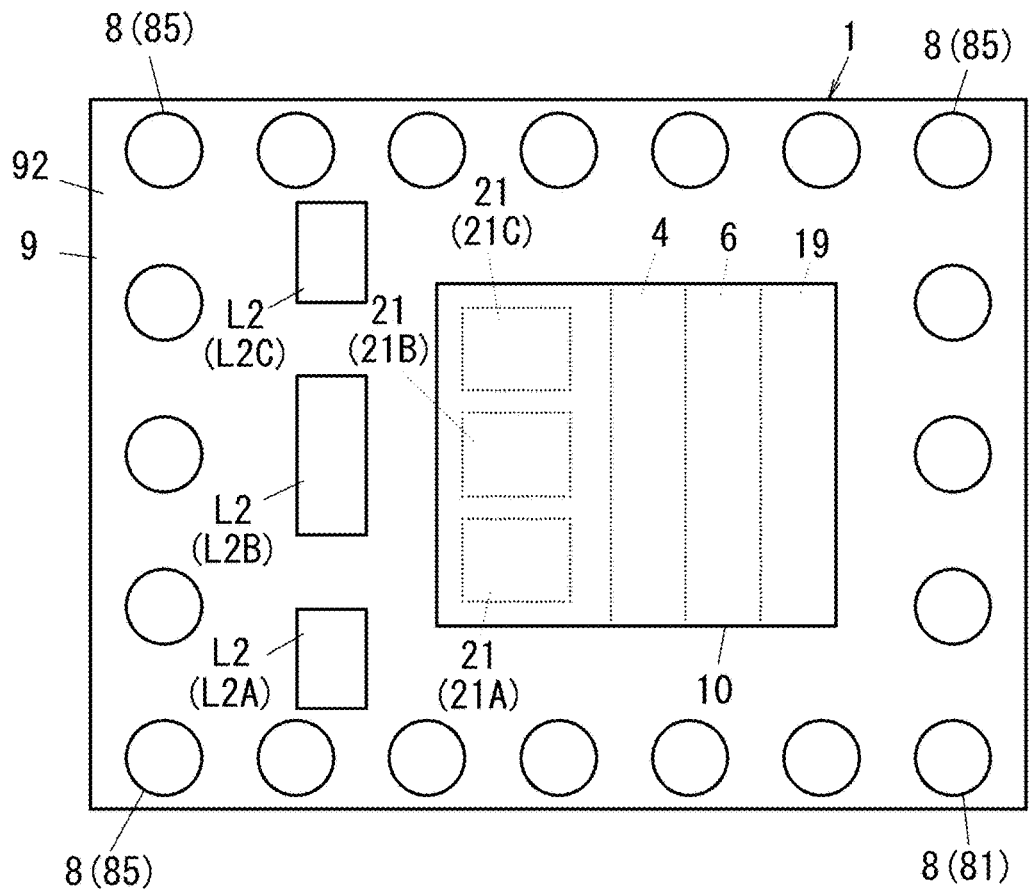
FIG. 2 is a bottom view of the radio-frequency module illustrated in FIG. 1.

A structure of the radio-frequency module 1 will now be described with reference to FIGS. 1 to 3.

The radio-frequency module 1 includes the mount board 9, the plurality of external connection terminals 8, the plurality of (e.g., three) low-noise amplifiers 21, the first inductor L1, and the plurality of (e.g., three) second inductors L2. The plurality of external connection terminals 8 include the antenna terminal 81, the plurality of ground terminals 85, and the signal output terminal 83. The radio-frequency module 1 also includes the plurality of (e.g., three) reception filters 22 and the plurality of (e.g., three) input matching circuits 23. The radio-frequency module 1 further includes the antenna switch 4, the band selection switch 6, and the band selection switch 19. In the radio-frequency module 1, the plurality of low-noise amplifiers 21, the antenna switch 4, the band selection switch 6, and the band selection switch 19 are included in one IC chip 10.

The mount board 9 has the first principal surface 91 and the second principal surface 92 opposite each other in the direction of thickness D1 of the mount board 9. The mount board 9 is, for example, a multilayer substrate that includes a plurality of dielectric layers and a plurality of conductive layers. The plurality of dielectric layers and the plurality of conductive layers are stacked in the direction of thickness D1 of the mount board 9. The plurality of conductive layers are each formed in a predetermined pattern. The plurality of conductive layers each include one or more conductor portions in one plane orthogonal to the direction of thickness D1 of the mount board 9. For example, the conductive layers each are made of copper. The plurality of conductive layers include a ground layer. In the radio-frequency module 1, the plurality of ground terminals 85 are electrically connected to the ground layer by way of, for example, via conductors of the mount board 9. Examples of the mount board 9 include, but are not limited to, a low-temperature co-fired ceramic (LTCC) substrate. The mount board 9 may be, for example, a printed wiring board, a high-temperature co-fired ceramic (HTCC) substrate, or a resin multilayer substrate.

The mount board 9 is not limited to an LTCC substrate and may be, for example, a wiring structure. The wiring structure is, for example, a multilayer structure. The multilayer structure includes at least one insulating layer and at least one conductive layer. The insulating layer is formed in a predetermined pattern. When the multilayer structure includes a plurality of insulating layers, the plurality of insulating layers are each formed in a predetermined pattern. The conductive layer is formed in a predetermined pattern different from the predetermined pattern of the insulating layer. When the multilayer structure includes a plurality of conductive layers, the plurality of conductive layers are each formed in a predetermined pattern. The conductive layer may include one or more rewiring portions. Of two surfaces (first and second surfaces) of the multilayer structure (wiring structure) opposite each other in the direction of thickness of the multilayer structure, the first surface corresponds to the first principal surface 91 of the mount board 9 and the second surface corresponds to the second principal surface 92 of the mount board 9.

The first principal surface 91 and the second principal surface 92 of the mount board 9 are spaced apart in the direction of thickness D1 of the mount board 9 and intersect the direction of thickness D1 of the mount board 9. The first principal surface 91 of the mount board 9 is orthogonal to, for example, the direction of thickness D1 of the mount board 9, but may contain, for example, the side faces of conductor portions as surfaces not orthogonal to the direction of thickness D1. Similarly, the second principal surface 92 of the mount board 9 is orthogonal to, for example, the direction of thickness D1 of the mount board 9, but may contain, for example, the side faces of conductor portions as surfaces not orthogonal to the direction of thickness D1. The first principal surface 91 and the second principal surface 92 of the mount board 9 may have microscopic asperities, depressions, or protrusions.

The plurality of external connection terminals 8 are disposed on the second principal surface 92 of the mount board 9. For example, the plurality of external connection terminals 8 are made of metal (e.g., copper or copper alloy).

The plurality of external connection terminals 8 include the antenna terminal 81, the signal output terminal 83, and the plurality of ground terminals 85. The plurality of ground terminals 85 are connected to the ground layer of the mount board 9 by way of, for example, via conductors. The ground layer is a circuit ground of the radio-frequency module 1.

The plurality of external connection terminals 8 are substantially columnar electrodes. For example, the columnar electrodes here are electrodes of a substantially circular columnar shape.

In the radio-frequency module 1 according to the first embodiment, the IC chip 10 includes the plurality of low-noise amplifiers 21, the antenna switch 4, the band selection switch 6, and the band selection switch 19. The plurality of low-noise amplifiers 21 each include the transistor Tr serving as an amplifying element. The transistor Tr is a field-effect transistor. The antenna switch 4 includes, for example, a plurality of field-effect transistors. The band selection switch 6 also includes, for example, a plurality of field-effect transistors. The band selection switch 19 also includes, for example, a plurality of field-effect transistors. The IC chip 10 is, for example, a silicon (Si) IC chip.

The IC chip 10 is mounted on the second principal surface 92 of the mount board 9. Here, the term "mounted" means that the IC chip 10 is disposed on (or mechanically connected to) the second principal surface 92 of the mount board 9, and also means that the IC chip 10 is electrically connected to the mount board 9 (or to its appropriate conductor portions). That is, in the radio-frequency module 1, the IC chip 10 is disposed on the second principal surface 92 of the mount board 9. In the radio-frequency module 1, therefore, the plurality of low-noise amplifiers 21, the antenna switch 4, the band selection switch 6, and the band selection switch 19 are disposed on the second principal surface 92 of the mount board 9. In plan view in the direction of thickness D1 of the mount board 9, the IC chip 10 is substantially rectangular in outer shape.

The first inductor L1 is, for example, a surface-mount inductor. The first inductor L1 is mounted on the first principal surface 91 of the mount board 9. This means that the first inductor L1 is disposed on the first principal surface 91 of the mount board 9. In plan view in the direction of thickness D1 of the mount board 9, the first inductor L1 is substantially rectangular in outer shape.

The plurality of second inductors L2 are, for example, surface-mount inductors. The second inductors L2 are mounted on the second principal surface 92 of the mount board 9. This means that the second inductors L2 are disposed on the second principal surface 92 of the mount board 9. In plan view in the direction of thickness D1 of the mount board 9, the plurality of second inductors L2 are each substantially rectangular in outer shape.

The plurality of reception filters 22 each are, for example, an acoustic wave filter. In plan view in the direction of thickness D1 of the mount board 9, the plurality of reception filters 22 are each substantially rectangular in outer shape. The acoustic wave filter is, for example, a ladder filter that includes a plurality of (e.g., four) series-arm resonators and a plurality of (e.g., three) parallel-arm resonators. The plurality of series-arm resonators and the plurality of parallel-arm resonators of the acoustic wave filter are each constituted by an acoustic wave resonator. The acoustic wave filter is, for example, a surface acoustic wave filter that uses surface acoustic waves. In the surface acoustic wave filter, the plurality of series-arm resonators and the plurality of parallel-arm resonators each are, for example, a surface acoustic wave (SAW) resonator that includes an interdigital transducer (IDT) electrode. The plurality of reception filters 22 are mounted on the first principal surface 91 of the mount board 9. This means that the plurality of reception filters 22 are disposed on the first principal surface 91 of the mount board 9. The plurality of reception filters 22 each may either be an acoustic wave filter of a bare chip type, or an acoustic wave filter having a package structure. In plan view in the direction of thickness D1 of the mount board 9, the plurality of reception filters 22 are each substantially rectangular in outer shape.

The plurality of input matching circuits 23 each include the third inductor L3 and the fourth inductor L4. For convenience of explanation, the third inductor L3 and the fourth inductor L4 of the input matching circuit 23A may hereinafter be referred to as a third inductor L3A and a fourth inductor L4A, respectively, the third inductor L3 and the fourth inductor L4 of the input matching circuit 23B may hereinafter be referred to as a third inductor L3B and a fourth inductor L4B, respectively, and the third inductor L3 and the fourth inductor L4 of the input matching circuit 23C may hereinafter be referred to as a third inductor L3C and a fourth inductor L4C, respectively.

The plurality of third inductors L3 are, for example, surface-mount inductors. The plurality of third inductors L3 are mounted on the first principal surface 91 of the mount board 9. This means that the plurality of third inductors L3 are disposed on the first principal surface 91 of the mount board 9. In plan view in the direction of thickness D1 of the mount board 9, the plurality of third inductors L3 are each substantially rectangular in outer shape.

The plurality of fourth inductors L4 are, for example, surface-mount inductors. The plurality of fourth inductors L4 are mounted on the first principal surface 91 of the mount board 9. This means that the plurality of fourth inductors L4 are disposed on the first principal surface 91 of the mount board 9. In plan view in the direction of thickness D1 of the mount board 9, the plurality of fourth inductors L4 are each substantially rectangular in outer shape.

Figure 3:
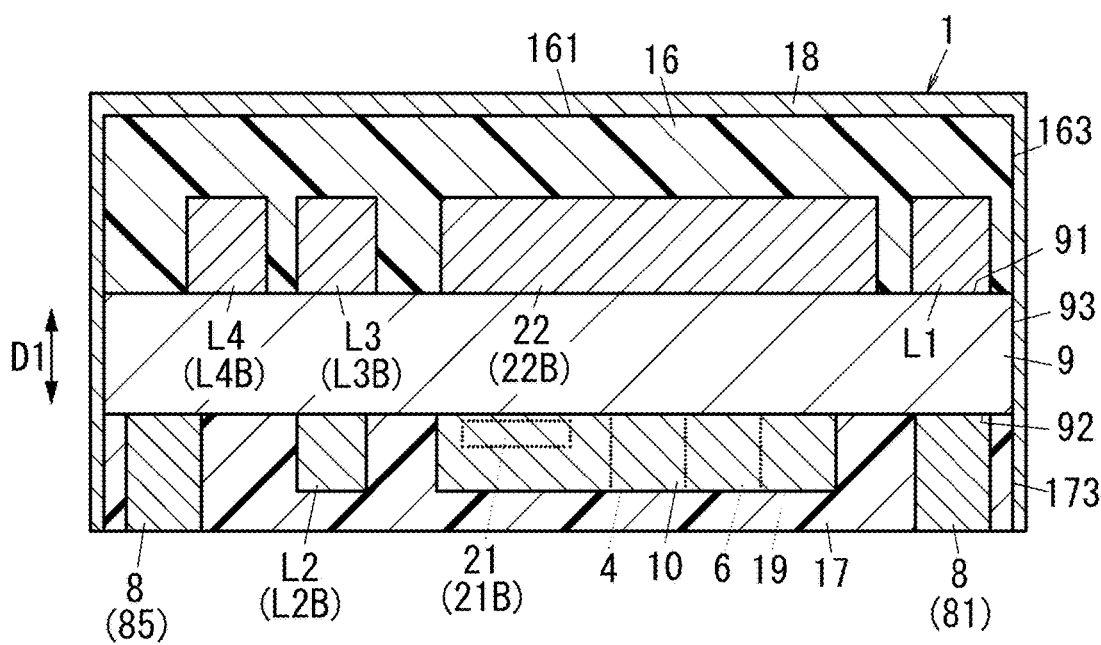
FIG. 3 is a cross-sectional view taken along line A-A in the radio-frequency module illustrated in FIG. 1.
Figure 4:
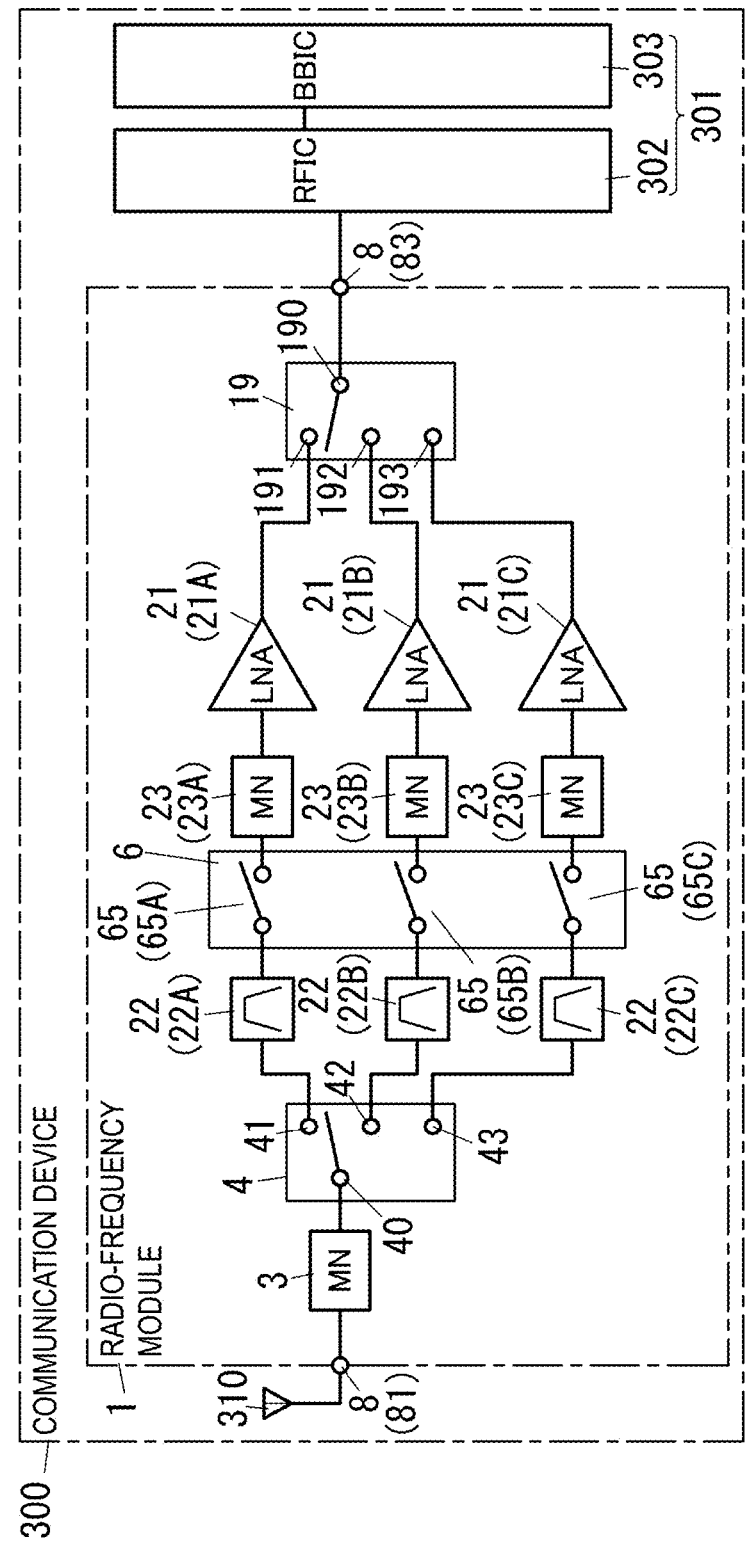
FIG. 4 is a circuit configuration diagram of a communication device including the radio-frequency module illustrated in FIG. 1.

The radio-frequency module 1 further includes a first resin layer 16 (see FIG. 3). On the first principal surface 91 of the mount board 9, the first resin layer 16 covers at least part of each of a plurality of electronic components (e.g., the plurality of reception filters 22, the first inductor L1, the plurality of third inductors L3, and the plurality of fourth inductors L4) disposed on the first principal surface 91 of the mount board 9. The first resin layer 16 contains resin (e.g., epoxy resin). The first resin layer 16 may contain a filler, as well as the resin.

The radio-frequency module 1 further includes a second resin layer 17 (see FIG. 3). On the second principal surface 92 of the mount board 9, the second resin layer 17 covers at least part of each of a plurality of electronic components (e.g., the IC chip 10 and the plurality of second inductors L2) disposed on the second principal surface 92 of the mount board 9. The second resin layer 17 contains resin (e.g., epoxy resin). The second resin layer 17 may contain a filler, as well as the resin. The second resin layer 17 and the first resin layer 16 may be made of either the same material or different materials.

The radio-frequency module 1 further includes a shield layer 18 (see FIG. 3). Materials for the shield layer 18 include, for example, one or more types of metals. For example, the materials for the shield layer 18 include silver. The shield layer 18 covers a principal surface 161 of the first resin layer 16 remote from the mount board 9, an outer periphery 163 of the first resin layer 16, an outer periphery 93 of the mount board 9, and an outer periphery 173 of the second resin layer 17. The shield layer 18 is in contact with at least part of the outer periphery of the ground layer of the mount board 9. This can make the potential of the shield layer 18 equal to the potential of the ground layer.

(1.3) Layout of Radio-Frequency Module

In plan view in the direction of thickness D1 of the mount board 9, the first inductor L1 is disposed near one of four corners of the first principal surface 91 of the mount board 9, which is substantially rectangular in shape. Also, in plan view in the direction of thickness D1 of the mount board 9, the antenna terminal 81 is disposed near one of four corners of the second principal surface 92 of the mount board 9, which is substantially rectangular in shape. Part of the first inductor L1 overlaps the antenna terminal 81 in plan view in the direction of thickness D1 of the mount board 9. When referring to "overlap" in plan view, this refers to respective footprints of at least two components at least partially overlapping one another in plan view.

In the radio-frequency module 1 according to the first embodiment, the first inductor L1 connected to the antenna terminal 81 is disposed on the first principal surface 91 of the mount board 9. Also, in the radio-frequency module 1, the plurality of second inductors L2 connected to the source terminals of the transistors Tr (see FIG. 5) of the respective low-noise amplifiers 21 are disposed on the second principal surface 92 of the mount board 9. In the radio-frequency module 1, the first inductor L1 does not overlap the plurality of second inductors L2 in plan view in the direction of thickness D1 of the mount board 9.

In the radio-frequency module 1 according to the first embodiment, the third inductor L3 and the fourth inductor L4 in each of the plurality of input matching circuits 23 are adjacent in plan view in the direction of thickness D1 of the mount board 9. This means that on the first principal surface 91 of the mount board 9, the third inductor L3 and the fourth inductor L4 are adjacent to each other, with no other circuit elements disposed on a straight line connecting the third inductor L3 and the fourth inductor L4. For example, the reception filter 22 is located on one side of the third inductor L3 opposite the fourth inductor L4. For each of the plurality of input matching circuits 23, the third inductor L3 is not adjacent to the first inductor L1 in plan view in the direction of thickness D1 of the mount board 9. On the first principal surface 91 of the mount board 9, at least one reception filter 22 is disposed between the third inductor L3 and the first inductor L1 in plan view in the direction of thickness D1 of the mount board 9. For each of the plurality of input matching circuits 23, the distance between the third inductor L3 and the first inductor L1 is greater than the distance between the third inductor L3 and the fourth inductor L4.

In the radio-frequency module 1 according to the first embodiment, at least part of the second inductor L2A corresponding to the low-noise amplifier 21A overlaps the third inductor L3A corresponding to the low-noise amplifier 21A in plan view in the direction of thickness D1 of the mount board 9. The second inductor L2A corresponding to the low-noise amplifier 21A does not overlap the third inductors L3B and L3C corresponding to the other low-noise amplifiers 21B and 21C, respectively, in plan view in the direction of thickness D1 of the mount board 9. The second inductor L2A corresponding to the low-noise amplifier 21A does not overlap the fourth inductors L4B and L4C corresponding to the other low-noise amplifiers 21B and 21C, respectively, in plan view in the direction of thickness D1 of the mount board 9.

Also, in the radio-frequency module 1 according to the first embodiment, at least part of the second inductor L2B corresponding to the low-noise amplifier 21B overlaps the third inductor L3B corresponding to the low-noise amplifier 21B in plan view in the direction of thickness D1 of the mount board 9. The second inductor L2B corresponding to the low-noise amplifier 21B does not overlap the third inductors L3A and L3C corresponding to the other low-noise amplifiers 21A and 21C, respectively, in plan view in the direction of thickness D1 of the mount board 9. The second inductor L2B corresponding to the low-noise amplifier 21B does not overlap the fourth inductors L4A and L4C corresponding to the other low-noise amplifiers 21A and 21C, respectively, in plan view in the direction of thickness D1 of the mount board 9.

Also, in the radio-frequency module 1 according to the first embodiment, at least part of the second inductor L2C corresponding to the low-noise amplifier 21C overlaps the third inductor L3C corresponding to the low-noise amplifier 21C in plan view in the direction of thickness D1 of the mount board 9. The second inductor L2C corresponding to the low-noise amplifier 21C does not overlap the third inductors L3A and L3B corresponding to the other low-noise amplifiers 21A and 21B, respectively, in plan view in the direction of thickness D1 of the mount board 9. The second inductor L2C corresponding to the low-noise amplifier 21C does not overlap the fourth inductors L4A and L4B corresponding to the other low-noise amplifiers 21A and 21B, respectively, in plan view in the direction of thickness D1 of the mount board 9.

(1.4) Summary (1.4.1) Radio-Frequency Module

The radio-frequency module 1 according to the first embodiment includes the mount board 9, the antenna terminal 81 and the ground terminals 85, the plurality of low-noise amplifiers 21, the first inductor L1, and the plurality of second inductors L2. The mount board 9 has the first principal surface 91 and the second principal surface 92 opposite each other. The antenna terminal 81 and the ground terminals 85 are disposed on the mount board 9. The plurality of low-noise amplifiers 21 are disposed on the mount board 9. The plurality of low-noise amplifiers 21 each include the transistor Tr for amplification. The first inductor L1 is disposed on one of the first principal surface 91 and the second principal surface 92 of the mount board 9. The first inductor L1 is connected to the antenna terminal 81. The plurality of second inductors L2 are disposed on the other of the first principal surface 91 and the second principal surface 92 of the mount board 9. The plurality of second inductors L2 are each connected between the transistor Tr and the ground terminal 85.

The radio-frequency module 1 according to the first embodiment can reduce the noise figure of each of the plurality of low-noise amplifiers 21. In the radio-frequency module 1 according to the first embodiment, the first inductor L1 and the plurality of second inductors L2 are disposed on different principal surfaces (the first principal surface 91 and the second principal surface 92) of the mount board 9. This makes it less likely that the first inductor L1 and the plurality of second inductors L2 will be magnetically coupled, and can thus reduce the noise figure of each of the plurality of low-noise amplifiers 21.

Also, in the radio-frequency module 1 according to the first embodiment, the first inductor L1 overlaps none of the plurality of second inductors L2 in plan view in the direction of thickness D1 of the mount board 9. This makes it easier to suppress magnetic coupling between the first inductor L1 and the plurality of second inductors L2, and can thus reduce the noise figure of each of the plurality of low-noise amplifiers 21 in the radio-frequency module 1 according to the first embodiment.

Also, in the radio-frequency module 1 according to the first embodiment, at least part of the third inductor L3A overlaps the second inductor L2A in plan view in the direction of thickness D1 of the mount board 9. This facilitates magnetic coupling between the third inductor L3A and the second inductor L2A, and can thus reduce the noise figure of the low-noise amplifier 21A in the radio-frequency module 1. Also, in the radio-frequency module 1 according to the first embodiment, at least part of the third inductor L3B overlaps the second inductor L2B in plan view in the direction of thickness D1 of the mount board 9. This facilitates magnetic coupling between the third inductor L3B and the second inductor L2B, and can thus reduce the noise figure of the low-noise amplifier 21B in the radio-frequency module 1. Also, in the radio-frequency module 1 according to the first embodiment, at least part of the third inductor L3C overlaps the second inductor L2C in plan view in the direction of thickness D1 of the mount board 9. This facilitates magnetic coupling between the third inductor L3C and the second inductor L2C, and can thus reduce the noise figure of the low-noise amplifier 21C in the radio-frequency module 1.

(1.4.2) Communication Device

The communication device 300 according to the first embodiment includes the signal processing circuit 301 and the radio-frequency module 1. The signal processing circuit 301 is connected to the radio-frequency module 1 and configured to process a radio-frequency signal (reception signal).

The communication device 300 according to the first embodiment includes the radio-frequency module 1. This makes it possible to reduce the noise figure of each of the plurality of low-noise amplifiers 21.

A plurality of electronic components constituting the signal processing circuit 301 may either be mounted, for example, on the circuit board having the radio-frequency module 1 thereon or may be mounted on another circuit board.

(1.5) Modifications (1.5.1) First Modification

Figure 6:
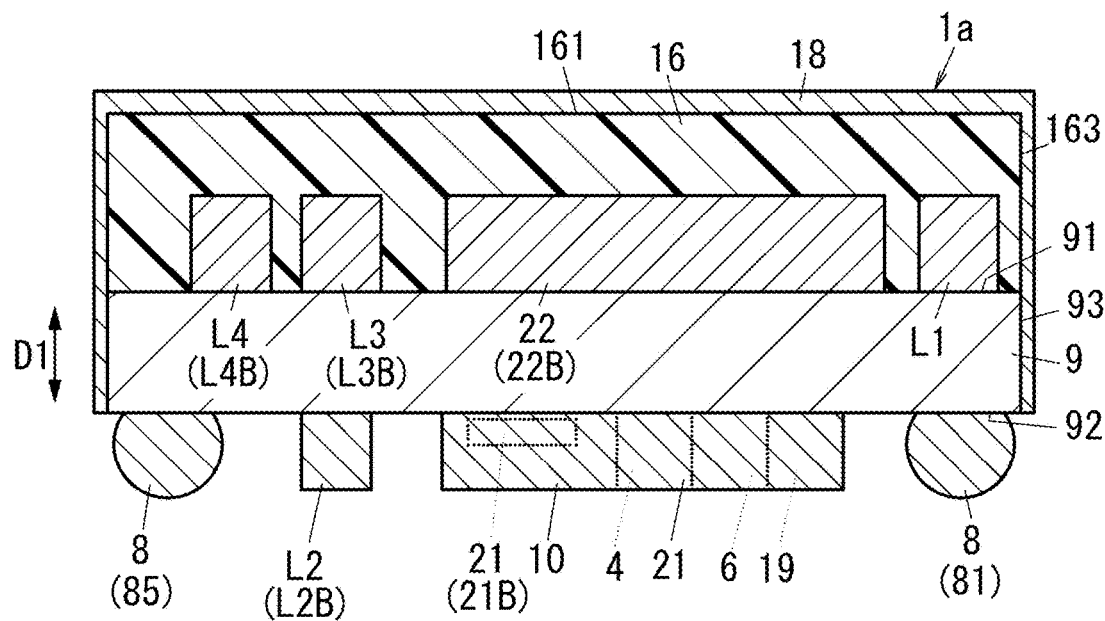
FIG. 6 is a cross-sectional view of a radio-frequency module according to a first modification of the first embodiment.

A radio-frequency module 1a according to a first modification of the first embodiment will now be described with reference to FIG. 6. Of components of the radio-frequency module 1a according to the first modification, the same ones as those of the radio-frequency module 1 according to the first embodiment are denoted by the same reference numerals and their description will be omitted.

The radio-frequency module 1a according to the first modification differs from the radio-frequency module 1 according to the first embodiment in that the plurality of external connection terminals 8 are ball bumps. The radio-frequency module 1a according to the first modification also differs from the radio-frequency module 1 according to the first embodiment in that the radio-frequency module 1a does not include the second resin layer 17 of the radio-frequency module 1 according to the first embodiment.

The ball bumps constituting the plurality of external connection terminals 8 are made of, for example, gold, copper, or solder.

The plurality of external connection terminals 8 may include both ball bumps and substantially columnar electrodes.

(1.5.2) Second Modification

Figure 7:
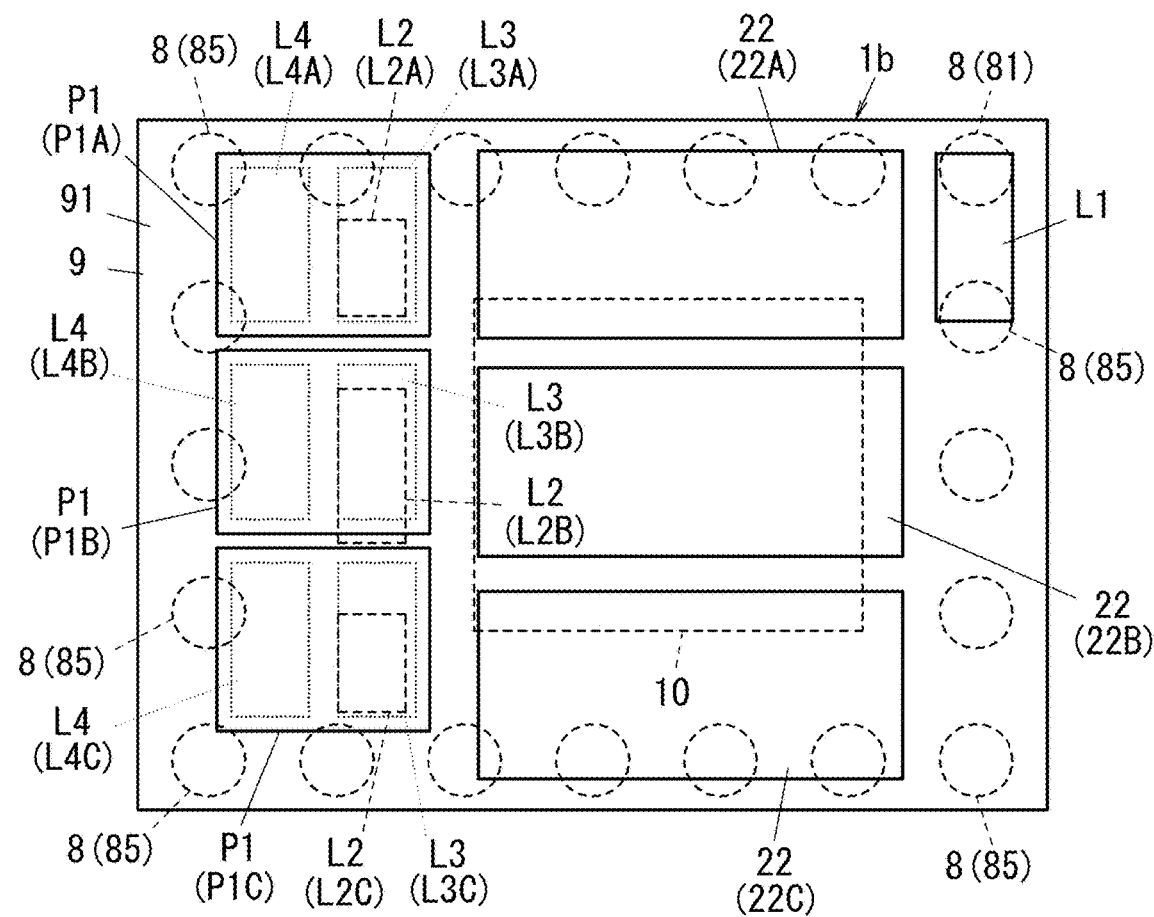
FIG. 7 is a plan view of a radio-frequency module according to a second modification of the first embodiment.

A radio-frequency module 1b according to a second modification of the first embodiment will now be described with reference to FIG. 7. Of components of the radio-frequency module 1b according to the second modification, the same ones as those of the radio-frequency module 1 according to the first embodiment are denoted by the same reference numerals and their description will be omitted.

The radio-frequency module 1b according to the second modification differs from the radio-frequency module 1 according to the first embodiment in that it includes a package P1 containing the third inductor L3 and the fourth inductor L4 for each of the plurality of (e.g., three) input matching circuits 23 corresponding to the plurality of (e.g., three) low-noise amplifiers 21. That is, the radio-frequency module 1b according to the second modification differs from the radio-frequency module 1 according to the first embodiment in that it includes a plurality of (e.g., three) packages P1.

Hereinafter, the package P1 containing the third inductor L3A and the fourth inductor L4A will be referred to as a package P1A, the package P1 containing the third inductor L3B and the fourth inductor L4B will be referred to as a package P1B, and the package P1 containing the third inductor L3C and the fourth inductor L4C will be referred to as a package P1C.

In the radio-frequency module 1b according to the second modification, where the package P1A is mounted on the first principal surface 91 of the mount board 9, the third inductor L3A and the fourth inductor L4A are disposed on the first principal surface 91 of the mount board 9. In the radio-frequency module 1b according to the second modification, where the package P1B is mounted on the first principal surface 91 of the mount board 9, the third inductor L3B and the fourth inductor L4B are disposed on the first principal surface 91 of the mount board 9. In the radio-frequency module 1b according to the second modification, where the package P1C is mounted on the first principal surface 91 of the mount board 9, the third inductor L3C and the fourth inductor L4C are disposed on the first principal surface 91 of the mount board 9.

As described above, the radio-frequency module 1b according to the second modification includes the packages P1 each containing the third inductor L3 and the fourth inductor L4. This stabilizes the magnetic coupling of the third inductor L3 and the fourth inductor L4 and reduces variations in the noise figure of the low-noise amplifier 21.

(1.5.3) Third Modification

Figure 8:
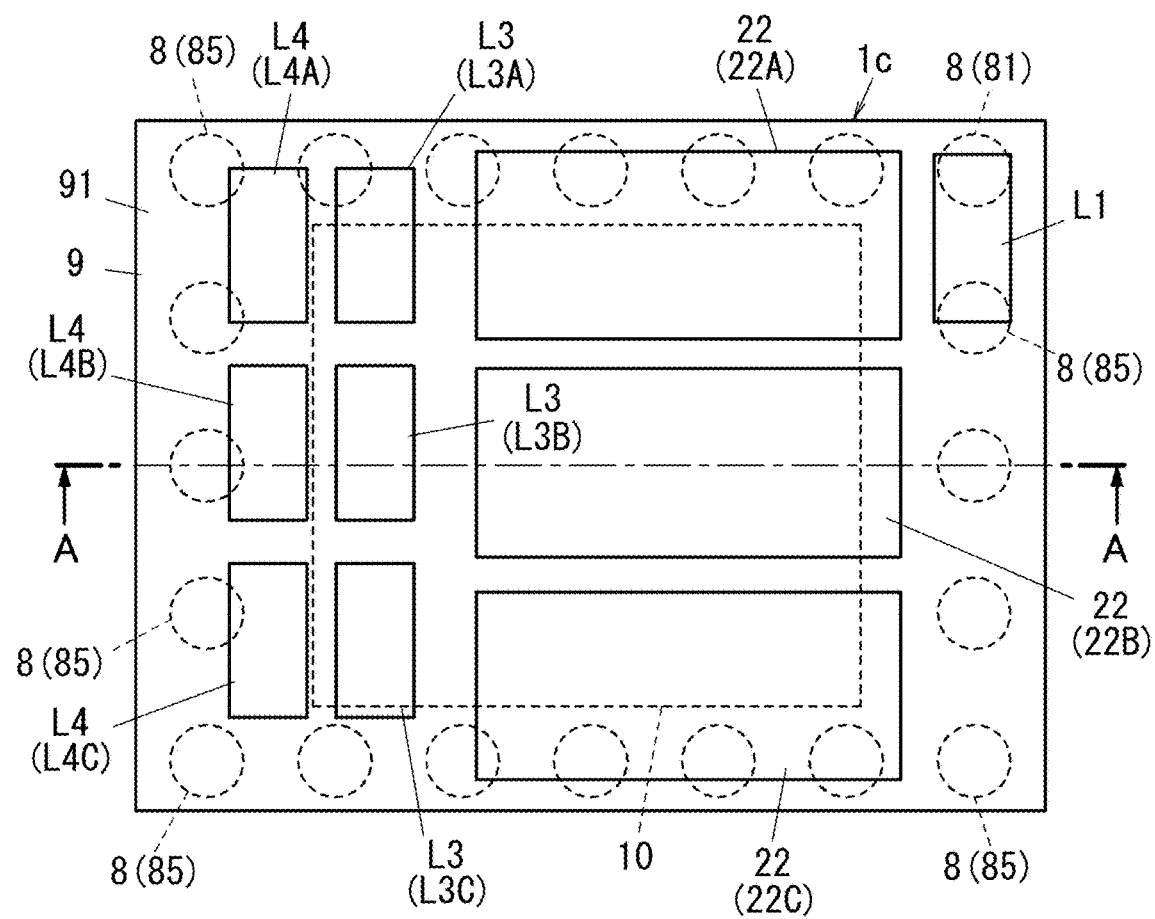
FIG. 8 is a plan view of a radio-frequency module according to a third modification of the first embodiment.
Figure 9:
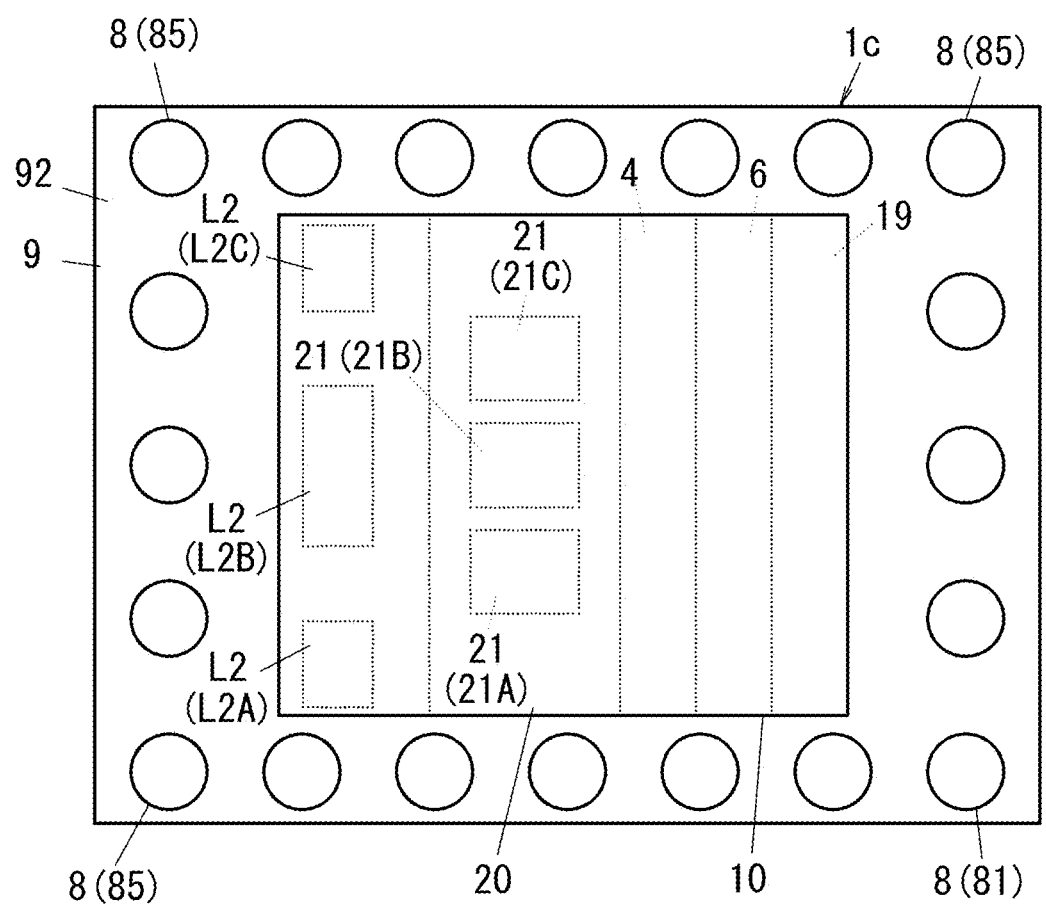
FIG. 9 is a bottom view of the radio-frequency module illustrated in FIG. 8.
Figure 10:
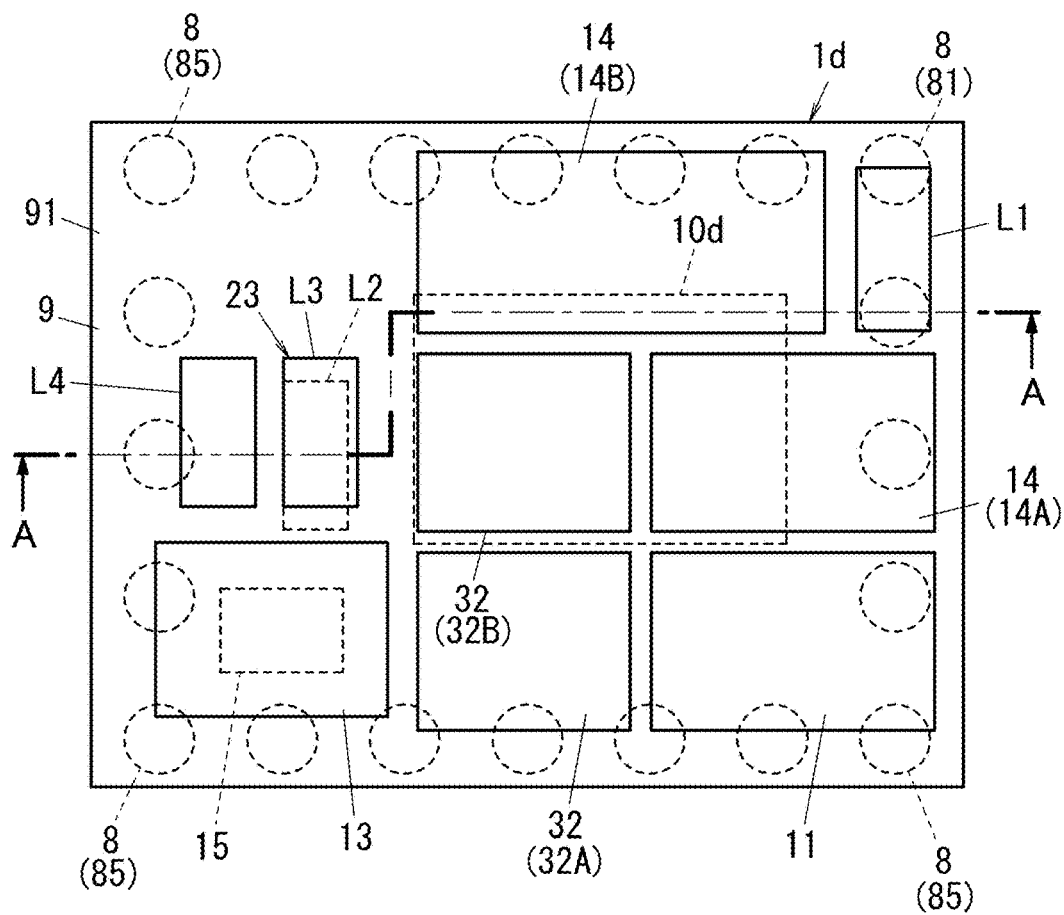
FIG. 10 is a plan view of a radio-frequency module according to a second embodiment.
Figure 11:
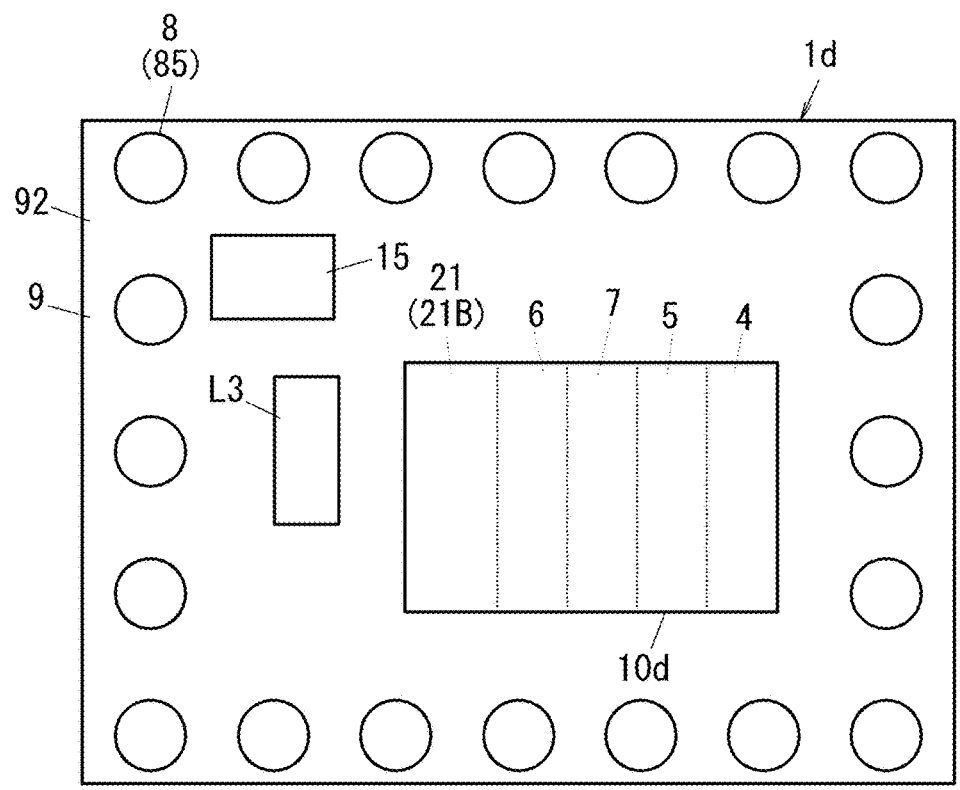
FIG. 11 is a bottom view of the radio-frequency module illustrated in FIG. 10.
Figure 12:
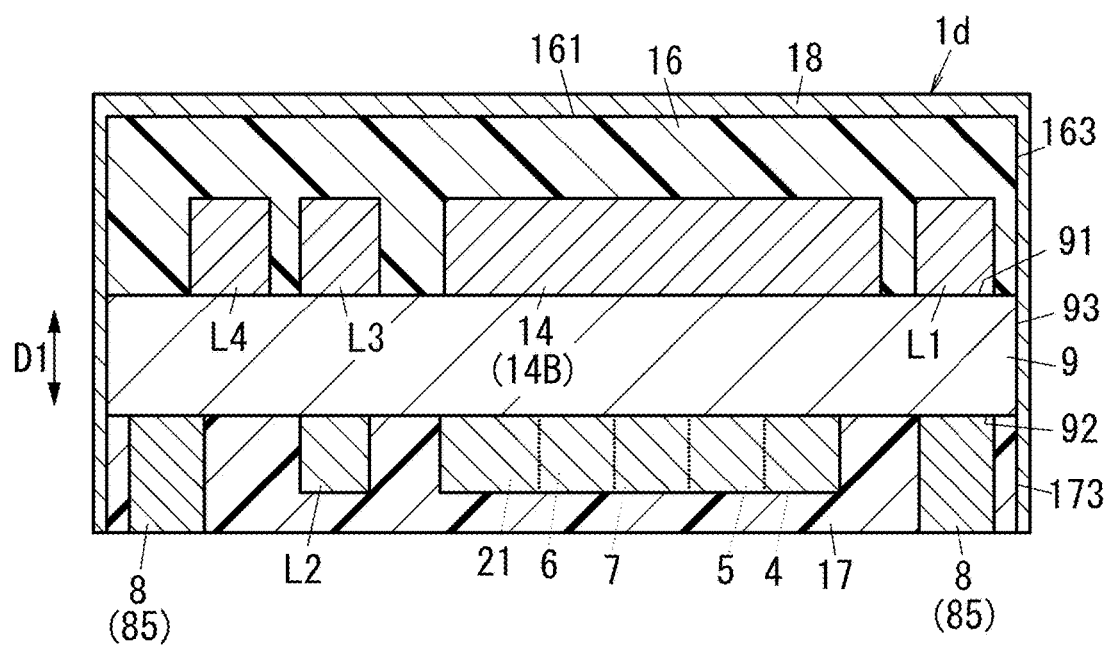
FIG. 12 is a cross-sectional view taken along line A-A in the radio-frequency module illustrated in FIG. 10.
Figure 13:
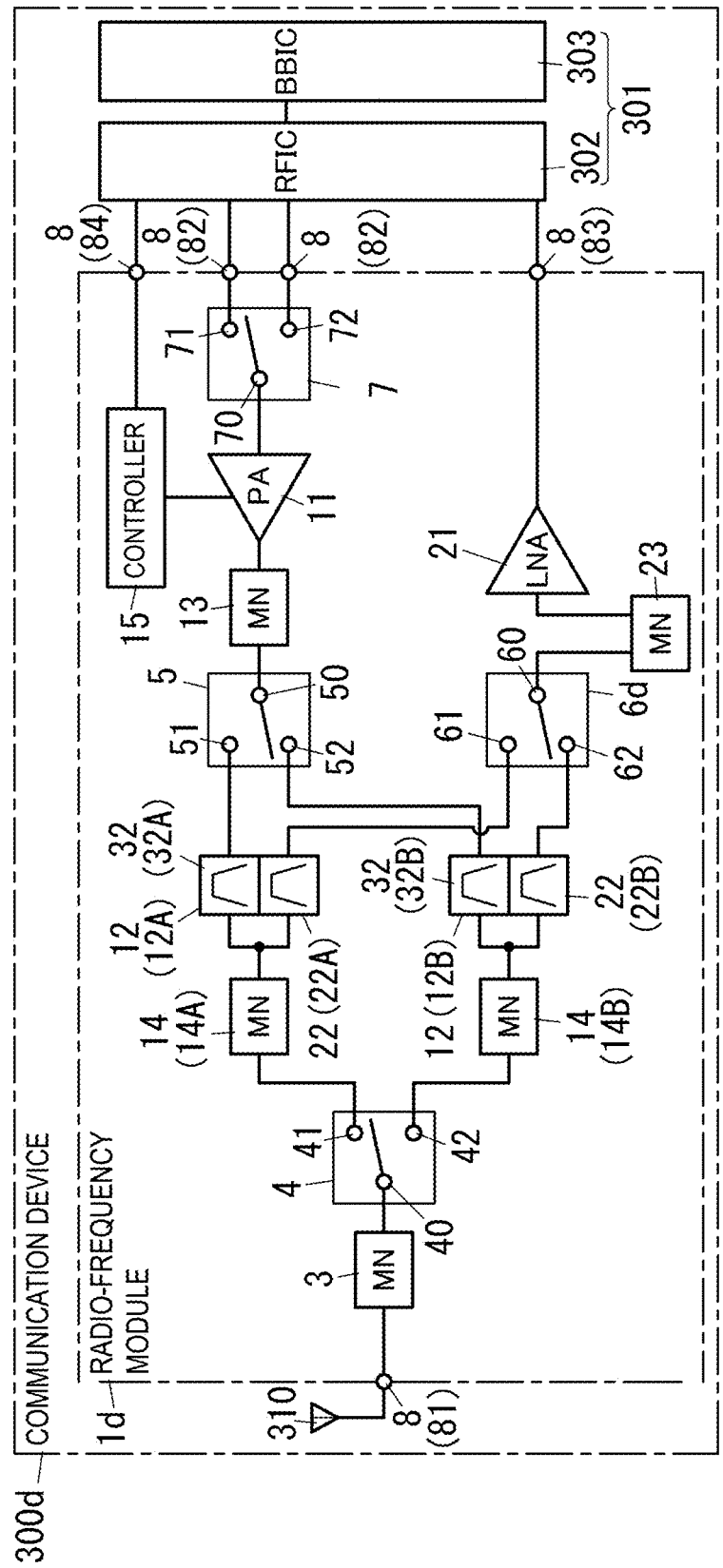
FIG. 13 is a circuit configuration diagram of a communication device including the radio-frequency module illustrated in FIG. 10.

A radio-frequency module 1c according to a third modification of the first embodiment will now be described with reference to FIGS. 8 and 9. Of components of the radio-frequency module 1c according to the third modification, the same ones as those of the radio-frequency module 1 according to the first embodiment are denoted by the same reference numerals and their description will be omitted.

The radio-frequency module 1c according to the third modification differs from the radio-frequency module 1 according to the first embodiment in that the plurality of second inductors L2 are not surface-mount inductors and are included in the IC chip 10. This can reduce the size of the radio-frequency module 1c according to the third modification.

Second Embodiment

A radio-frequency module 1d and a communication device 300d according to a second embodiment will now be described with reference to FIGS. 10 to 13. Of components of the radio-frequency module 1d according to the second embodiment, the same ones as those of the radio-frequency module 1 according to the first embodiment are denoted by the same reference numerals and their description will be appropriately omitted.

(2) Radio-Frequency Module and Communication Device

(2.1) Circuit Configuration of Radio-Frequency Module and Communication Device The radio-frequency module 1d according to the second embodiment is used, for example, for the communication device 300d (see FIG. 13) that supports multi-mode and multi-band. Examples of the communication device 300d include, but are not limited to, a mobile phone (e.g., smartphone). The communication device 300d may be, for example, a wearable terminal (e.g., smartwatch). The radio-frequency module 1d is a module that supports, for example, the 4G standard or the 5G standard. The radio-frequency module 1d is a circuit that supports carrier aggregation and dual connectivity.

The radio-frequency module 1d is configured to amplify, for example, a transmission signal (radio-frequency signal) received from the signal processing circuit 301 and output the amplified signal to the antenna 310. At the same time, the radio-frequency module 1d is configured to amplify a reception signal (radio-frequency signal) received from the antenna 310 and output the amplified signal to the signal processing circuit 301. The signal processing circuit 301 is not a component of the radio-frequency module 1d, but is a component of the communication device 300d including the radio-frequency module 1d. The radio-frequency module 1d is controlled, for example, by the signal processing circuit 301 included in the communication device 300d. The communication device 300d includes the radio-frequency module 1d and the signal processing circuit 301. The communication device 300d further includes the antenna 310. The communication device 300d further includes a circuit board having the radio-frequency module 1d mounted thereon. The circuit board is, for example, a printed wiring board. The circuit board has ground electrodes to which a ground potential is applied.

The signal processing circuit 301 includes, for example, the RF signal processing circuit 302 and the baseband signal processing circuit 303. For example, the RF signal processing circuit 302 performs signal processing, such as upconversion, on a radio-frequency signal (transmission signal) output from the baseband signal processing circuit 303 and outputs the processed radio-frequency signal. Also, for example, the RF signal processing circuit 302 performs signal processing, such as downconversion, on a radio-frequency signal (reception signal) output from the radio-frequency module 1d and outputs the processed radio-frequency signal to the baseband signal processing circuit 303. The radio-frequency module 1d transmits radio-frequency signals (reception signal and transmission signal) between the antenna 310 and the RF signal processing circuit 302 of the signal processing circuit 301.

The radio-frequency module 1d includes the power amplifier 11, the low-noise amplifier 21, and the matching circuit 3 including the first inductor L1. The radio-frequency module 1d also includes an output matching circuit 13 connected to the power amplifier 11, and the input matching circuit 23 connected to the low-noise amplifier 21. The radio-frequency module 1d further includes a plurality of (e.g., two) duplexers 32. The plurality of duplexers 32 each include a transmission filter 12 and the reception filter 22. For convenience of explanation, one of the plurality of duplexers 32 may hereinafter be referred to as a duplexer 32A and the remaining one duplexer 32 may hereinafter be referred to as a duplexer 32B. Also, the transmission filter 12 and the reception filter 22 of the duplexer 32A may hereinafter be referred to as a transmission filter 12A and the reception filter 22A, respectively, and the transmission filter 12 and the reception filter 22 of the duplexer 32B may hereinafter be referred to as a transmission filter 12B and the reception filter 22B, respectively.

The radio-frequency module 1*d* further includes the switch 4 (antenna switch 4), a switch 5 (band selection switch 5), and a switch 6*d* (band selection switch 6*d*). The radio-frequency module 1*d* further includes a plurality of (e.g., two) matching circuits 14 corresponding one-to-one to the plurality of (e.g., two) duplexers 32. For convenience of explanation, one of the plurality of matching circuits 14 connected to the duplexer 32A may hereinafter be referred to as a matching circuit 14A, and the other of the plurality of matching circuits 14 connected to the duplexer 32B may hereinafter be referred to as a matching circuit 14B. The matching circuit 14A is connected between the selection terminal 41 of the antenna switch 4 and the duplexer 32A. The matching circuit 14B is connected between the selection terminal 42 of the antenna switch 4 and the duplexer 32B. The radio-frequency module 1*d* further includes a switch 7 (input-side switch 7). The radio-frequency module 1*d* further includes a controller 15.

The radio-frequency module 1*d* also includes the plurality of external connection terminals 8. The plurality of external connection terminals 8 include the antenna terminal 81, a plurality of (e.g., two) signal input terminals 82, the signal output terminal 83, a control terminal 84, and the plurality of ground terminals 85. The ground terminals 85 are terminals which are electrically connected to the ground electrodes on the circuit board of the communication device 300*d* and to which a ground potential is applied.

The power amplifier 11 has an input terminal and an output terminal. The power amplifier 11 amplifies a transmission signal in a first frequency band input to the input terminal and outputs the amplified signal from the output terminal. Here, the first frequency band includes, for example, a first communication band and a second communication band. The input terminal of the power amplifier 11 is connected to the input-side switch 7.

The input-side switch 7 has a common terminal 70 and a plurality of (e.g., two) selection terminals 71 and 72. The power amplifier 11 is connected to the common terminal 70, and the two signal input terminals 82 are connected to the two selection terminals 71 and 72. The input-side switch 7 is controlled, for example, by the signal processing circuit 301. The input-side switch 7 switches the connection between the common terminal 70 and the plurality of selection terminals 71 and 72 in accordance with a control signal from the RF signal processing circuit 302 of the signal processing circuit 301. The input-side switch 7 is, for example, a switch IC.

The band selection switch 5 has a common terminal 50 and a plurality of (e.g., two) selection terminals 51 and 52, and the power amplifier 11 is connected to the common terminal 50. The transmission filter 12A of the duplexer 32A is connected to the selection terminal 51 of the band selection switch 5, and the transmission filter 12B of the duplexer 32B is connected to the selection terminal 52 of the band selection switch 5. The band selection switch 5 is a switch capable of connecting, for example, at least one of the plurality of selection terminals 51 and 52 to the common terminal 50. The band selection switch 5 is a switch capable of enabling, for example, one-to-one and one-to-many connections.

The band selection switch 5 is controlled, for example, by the signal processing circuit 301. The band selection switch 5 switches the connection between the common terminal 50 and the plurality of selection terminals 51 and 52 in accordance with a control signal from the RF signal processing circuit 302 of the signal processing circuit 301. The band selection switch 5 is, for example, a switch IC.

The antenna switch 4 has the common terminal 40 and the plurality of (e.g., two) selection terminals 41 and 42. The duplexer 32A is connected to the selection terminal 41, with the matching circuit 14A interposed therebetween, and the duplexer 32B is connected to the selection terminal 42, with the matching circuit 14B interposed therebetween. The matching circuit 3 including the first inductor L1 is disposed between the common terminal 40 of the antenna switch 4 and the antenna terminal 81.

The output matching circuit 13 is connected between the output terminal of the power amplifier 11 and the common terminal 50 of the band selection switch 5.

The controller 15 controls the power amplifier 11. The controller 15 is connected to the control terminal 84, which is connected, for example, to the signal processing circuit 301. The controller 15 controls the power amplifier 11 on the basis of a control signal from the signal processing circuit 301.

The band selection switch 6*d* has a common terminal 60 and a plurality of (e.g., two) selection terminals 61 and 62. The low-noise amplifier 21 is connected to the common terminal 60 of the band selection switch 6*d*, the reception filter 22A of the duplexer 32A is connected to the selection terminal 61 of the band selection switch 6*d*, and the reception filter 22B of the duplexer 32B is connected to the selection terminal 62 of the band selection switch 6*d*. The band selection switch 6*d* is a switch capable of connecting, for example, at least one of the plurality of selection terminals 61 and 62 to the common terminal 60. The band selection switch 6*d* is a switch capable of enabling, for example, one-to-one and one-to-many connections.

The band selection switch 6*d* is controlled, for example, by the signal processing circuit 301. The band selection switch 6*d* switches the connection between the common terminal 60 and the plurality of selection terminals 61 and 62 in accordance with a control signal from the RF signal processing circuit 302 of the signal processing circuit 301. The band selection switch 6*d* is, for example, a switch IC.

The low-noise amplifier 21 has an input terminal and an output terminal. The low-noise amplifier 21 amplifies a reception signal in a second frequency band input to the input terminal and outputs the amplified signal from the output terminal. The second frequency band is, for example, the same as the first frequency band and includes the first communication band and the second communication band. The input terminal of the low-noise amplifier 21 is connected to the common terminal 60 of the band selection switch 6*d*, with the input matching circuit 23 interposed therebetween, and the output terminal of the low-noise amplifier 21 is connected to the signal output terminal 83. The output terminal of the low-noise amplifier 21 is connected to the signal processing circuit 301, with, for example, the signal output terminal 83 interposed therebetween. The signal output terminal 83 is a terminal for outputting a radio-frequency signal (reception signal) from the low-noise amplifier 21 to an external circuit (e.g., signal processing circuit 301).

The transmission filter 12A is a filter having a transmission band of, for example, the first communication band as a pass band, and the transmission filter 12B is a filter having a transmission band of, for example, the second communication band as a pass band. The reception filter 22A is a filter having a reception band of, for example, the first communication band as a pass band, and the reception filter 22B is a filter having a reception band of, for example, the second communication band as a pass band.

The matching circuit 3 is disposed between the antenna terminal 81 and the common terminal 40 of the antenna switch 4.

(2.2) Structure of Radio-Frequency Module

A structure of the radio-frequency module 1d will now be described with reference to FIGS. 10 to 13.

The radio-frequency module 1d includes the mount board 9, the power amplifier 11, the antenna terminal 81 and the ground terminals 85, the low-noise amplifier 21, the first inductor L1, and the second inductor L2. The low-noise amplifier 21 includes the transistor Tr (see FIG. 5) for amplification. The transistor Tr amplifies a radio-frequency signal (reception signal) input to the gate terminal and outputs the amplified signal. The second inductor L2 is connected between the source terminal of the transistor Tr and the ground terminal 85. The radio-frequency module 1d further includes the output matching circuit 13 and the input matching circuit 23. The radio-frequency module 1d further includes the plurality of external connection terminals 8. The radio-frequency module 1d further includes the plurality of (e.g., two) transmission filters 12A and 12B and the plurality of (e.g., two) reception filters 22A and 22B. The radio-frequency module 1d further includes the controller 15. The radio-frequency module 1d further includes the antenna switch 4, the band selection switch 5, the band selection switch 6, and the input-side switch 7.

The mount board 9 has the first principal surface 91 and the second principal surface 92 opposite each other in the direction of thickness D1 of the mount board 9. Examples of the mount board 9 include, but are not limited to, an LTCC substrate. The mount board 9 may be, for example, a printed wiring board, an HTCC substrate, a resin multilayer substrate, or a wiring structure.

The power amplifier 11 is, for example, a gallium arsenide (GaAs) IC chip that includes a heterojunction bipolar transistor (HBT) serving as an amplifying element, but the power amplifier 11 is not limited to this. The power amplifier 11 may be, for example, a Si IC chip, a silicon-germanium (SiGe) IC chip, or a gallium nitride (GaN) IC chip. For example, when the power amplifier 11 is, for example, a Si IC chip, the amplifying element may be either a bipolar transistor or a metal oxide semiconductor field-effect transistor (MOSFET).

The power amplifier 11 is mounted on the first principal surface 91 of the mount board 9. This means that the power amplifier 11 is disposed on the first principal surface 91 of the mount board 9. In plan view in the direction of thickness D1 of the mount board 9, the power amplifier 11 is substantially rectangular in outer shape.

The output matching circuit 13 (or an inductor constituting the output matching circuit 13) is mounted on the first principal surface 91 of the mount board 9. This means that the output matching circuit 13 is disposed on the first principal surface 91 of the mount board 9.

The controller 15 is, for example, a Si IC chip. The controller 15 is mounted on the second principal surface 92 of the mount board 9. This means that the controller 15 is disposed on the second principal surface 92 of the mount board 9. In plan view in the direction of thickness D1 of the mount board 9, the controller 15 is substantially rectangular in outer shape.

The plurality of duplexers 32A and 32B each may either be, for example, an acoustic wave filter of a bare chip type, or an acoustic wave filter having a package structure. The transmission filter 12A and the reception filter 22A each are, for example, a ladder filter that includes a plurality of series-arm resonators and a plurality of parallel-arm resonators. The transmission filter 12B and the reception filter 22B each are, for example, a ladder filter that includes a plurality of series-arm resonators and a plurality of parallel-arm resonators.

The low-noise amplifier 21 includes the transistor Tr (see FIG. 5) serving as an amplifying element. The transistor Tr is a field-effect transistor. The antenna switch 4 includes, for example, a plurality of field-effect transistors. The band selection switch 5 also includes, for example, a plurality of field-effect transistors. The band selection switch 6d also includes, for example, a plurality of field-effect transistors. The input-side switch 7 also includes, for example, a plurality of field-effect transistors. In the radio-frequency module 1d according to the second embodiment, an IC chip 10d includes the low-noise amplifier 21, the antenna switch 4, the band selection switch 5, the band selection switch 6d, and the input-side switch 7. The IC chip 10d is, for example, a Si IC chip.

The IC chip 10d is mounted on the second principal surface 92 of the mount board 9. In the radio-frequency module 1d according to the second embodiment, where the IC chip 10d is mounted on the second principal surface 92 of the mount board 9, the IC chip 10d is disposed on the second principal surface 92 of the mount board 9. This means that the low-noise amplifier 21, the antenna switch 4, the band selection switch 5, the band selection switch 6d, and the input-side switch 7 are disposed on the second principal surface 92 of the mount board 9. In plan view in the direction of thickness D1 of the mount board 9, the IC chip 10d is substantially rectangular in outer shape.

The third inductor L3 and the fourth inductor L4 included in the input matching circuit 23 are mounted on the first principal surface 91 of the mount board 9. This means that the third inductor L3 and the fourth inductor L4 are disposed on the first principal surface 91 of the mount board 9.

The plurality of external connection terminals 8 are disposed on the second principal surface 92 of the mount board 9. For example, the plurality of external connection terminals 8 are made of metal (e.g., copper or copper alloy).

The plurality of external connection terminals 8 include the antenna terminal 81, the plurality of signal input terminals 82, the signal output terminal 83, the control terminal 84, and the plurality of ground terminals 85. The plurality of ground terminals 85 are connected to the ground layer of the mount board 9 by way of, for example, via conductors. The ground layer is a circuit ground of the radio-frequency module 1d.

In the radio-frequency module 1d according to the second embodiment, the plurality of external connection terminals 8 are substantially columnar electrodes. For example, the columnar electrodes here are electrodes of a substantially circular columnar shape.

The radio-frequency module 1d further includes the first resin layer 16. On the first principal surface 91 of the mount board 9, the first resin layer 16 covers at least part of each of a plurality of electronic components (e.g., the power amplifier 11, the first inductor L1, the duplexers 32A and 32B, the third inductor L3, the fourth inductor L4, the output matching circuit 13, and the matching circuits 14A and 14B) disposed on the first principal surface 91 of the mount board 9. The first resin layer 16 contains resin (e.g., epoxy resin). The first resin layer 16 may contain a filler, as well as the resin.

The radio-frequency module 1d further includes the second resin layer 17. On the second principal surface 92 of the mount board 9, the second resin layer 17 covers at least part of each of a plurality of electronic components (e.g., the IC chip 10d and the controller 15) disposed on the second principal surface 92 of the mount board 9. The second resin layer 17 contains resin (e.g., epoxy resin). The second resin layer 17 may contain a filler, as well as the resin. The second resin layer 17 and the first resin layer 16 may be made of either the same material or different materials.

The radio-frequency module 1d further includes the shield layer 18. Materials for the shield layer 18 include, for example, one or more types of metals. For example, the materials for the shield layer 18 include silver. The shield layer 18 covers the principal surface 161 of the first resin layer 16 remote from the mount board 9, the outer periphery 163 of the first resin layer 16, the outer periphery 93 of the mount board 9, and the outer periphery 173 of the second resin layer 17. The shield layer 18 is in contact with at least part of the outer periphery of the ground layer of the mount board 9. This can make the potential of the shield layer 18 equal to the potential of the ground layer.

(2.3) Layout of Radio-Frequency Module

In plan view in the direction of thickness D1 of the mount board 9, the first inductor L1 is disposed near one of four corners of the first principal surface 91 of the mount board 9, which is substantially rectangular in shape. Also, in plan view in the direction of thickness D1 of the mount board 9, the antenna terminal 81 is disposed near one of four corners of the second principal surface 92 of the mount board 9, which is substantially rectangular in shape. Part of the first inductor L1 overlaps the antenna terminal 81 in plan view in the direction of thickness D1 of the mount board 9.

In the radio-frequency module 1d according to the second embodiment, the first inductor L1 connected to the antenna terminal 81 is disposed on the first principal surface 91 of the mount board 9. Also, in the radio-frequency module 1d, the second inductor L2 connected to the source terminal of the transistor Tr (see FIG. 5) of the low-noise amplifier 21 is disposed on the second principal surface 92 of the mount board 9. In the radio-frequency module 1d, the first inductor L1 does not overlap the second inductor L2 in plan view in the direction of thickness D1 of the mount board 9.

In the radio-frequency module 1d according to the second embodiment, the third inductor L3 and the fourth inductor L4 are adjacent in plan view in the direction of thickness D1 of the mount board 9. This means that on the first principal surface 91 of the mount board 9, the third inductor L3 and the fourth inductor L4 are adjacent to each other, with no other circuit elements disposed on a straight line connecting the third inductor L3 and the fourth inductor L4. Another electronic component (e.g., duplexer 32B) is located on one side of the third inductors L3 opposite the fourth inductors L4. The third inductor L3 is not adjacent to the first inductor L1 in plan view in the direction of thickness D1 of the mount board 9. On the first principal surface 91 of the mount board 9, at least one electronic component is disposed between the third inductor L3 and the first inductor L1 in plan view in the direction of thickness D1 of the mount board 9. The distance between the third inductor L3 and the first inductor L1 is greater than the distance between the third inductor L3 and the fourth inductor L4.

In the radio-frequency module 1d according to the second embodiment, at least part of the second inductor L2 overlaps the third inductor L3 in plan view in the direction of thickness D1 of the mount board 9.

In the radio-frequency module 1d according to the second embodiment, the power amplifier 11 does not overlap the IC chip 10d in plan view in the direction of thickness D1 of the mount board 9. Also, in the radio-frequency module 1d, there is no circuit component that is disposed on the second principal surface 92 of the mount board 9 and overlaps the power amplifier 11 in plan view in the direction of thickness D1 of the mount board 9.

(2.4) Summary (2.4.1) Radio-Frequency Module

The radio-frequency module 1d according to the second embodiment includes the mount board 9, the antenna terminal 81 and the ground terminals 85, the low-noise amplifier 21, the first inductor L1, and the second inductor L2. The mount board 9 has the first principal surface 91 and the second principal surface 92 opposite each other. The antenna terminal 81 and the ground terminals 85 are disposed on the mount board 9. The low-noise amplifier 21 is disposed on the mount board 9. The low-noise amplifier 21 includes the transistor Tr for amplification. The first inductor L1 is disposed on one of the first principal surface 91 and the second principal surface 92 of the mount board 9. The first inductor L1 is connected to the antenna terminal 81. The second inductor L2 is disposed on the other of the first principal surface 91 and the second principal surface 92 of the mount board 9. The second inductor L2 is connected between the transistor Tr and the ground terminal 85.

The radio-frequency module 1d according to the second embodiment can reduce the noise figure of the low-noise amplifier 21. In the radio-frequency module 1d according to the second embodiment, the first inductor L1 and the second inductor L2 are disposed on different principal surfaces (i.e., the first principal surface 91 and the second principal surface 92) of the mount board 9. This makes it less likely that the first inductor L1 and the second inductor L2 will be magnetically coupled, and can thus reduce the noise figure of the low-noise amplifier 21.

Also, in the radio-frequency module 1d according to the second embodiment, the first inductor L1 does not overlap the second inductor L2 in plan view in the direction of thickness D1 of the mount board 9. This makes it easier to suppress magnetic coupling between the first inductor L1 and the second inductor L2, and can thus reduce the noise figure of the low-noise amplifier 21 in the radio-frequency module 1d according to the second embodiment.

Also, in the radio-frequency module 1d according to the second embodiment, at least part of the third inductor L3 overlaps the second inductor L2 in plan view in the direction of thickness D1 of the mount board 9. This facilitates magnetic coupling between the third inductor L3 and the second inductor L2, and can thus reduce the noise figure of the low-noise amplifier 21 in the radio-frequency module 1d.

(2.4.2) Communication Device

The communication device 300d according to the second embodiment includes the signal processing circuit 301 and the radio-frequency module 1d. The signal processing circuit 301 is connected to the radio-frequency module 1d and configured to process a radio-frequency signal (reception signal).

The communication device 300d according to the second embodiment includes the radio-frequency module 1d. This makes it possible to reduce the noise figure of the low-noise amplifier 21.

The first and second embodiments described above are merely examples of various embodiments of the present disclosure. The first and second embodiments can be variously modified depending on, for example, the design as long as the object of the present disclosure is achievable.

For example, any of the radio-frequency modules 1a, 1b, and 1c may be used in place of the radio-frequency module 1 of the communication device 300 according to the first embodiment.

Although the transistor Tr included in the low-noise amplifier 21 is a field-effect transistor, the transistor Tr is not limited to this. For example, the transistor Tr may be a bipolar transistor. When the transistor Tr is a bipolar transistor, the second inductor L2 is connected between the emitter of the bipolar transistor and the ground terminal 85.

In the radio-frequency modules 1, 1a, 1b, 1c, and 1d, each second inductor L2 may be replaced, for example, by a plurality of second inductors L2 having a smaller inductance and connected in series.

Although the radio-frequency module 1 according to the first embodiment includes a plurality of low-noise amplifiers 21, it is only required that at least one low-noise amplifier 21 be included.

In the radio-frequency modules 1, 1a, 1b, 1c, and 1d, the antenna terminal 81 and the ground terminals 85 are disposed on the second principal surface 92 of the mount board 9. However, the layout is not limited to this. That is, the antenna terminal 81 and the ground terminals 85 may be disposed on the first principal surface 91 of the mount board 9. Also, in the radio-frequency modules 1, 1a, 1b, 1c, and 1d, the first inductor L1 and the second inductor L2 are disposed on the first principal surface 91 and the second principal surface 92, respectively, of the mount board 9. However, the layout is not limited to this. That is, the first inductor L1 and the second inductor L2 may be disposed on the second principal surface 92 and the first principal surface 91, respectively, of the mount board 9.

The reception filters 22A and 22B do not necessarily need to be ladder filters and may be, for example, longitudinally coupled resonator-type surface acoustic wave filters.

Although the acoustic wave filters described above are ones that use surface acoustic waves or bulk acoustic waves, the acoustic wave filters are not limited to this. For example, the acoustic wave filters may be ones that use boundary acoustic waves or Lamb waves.

In the radio-frequency module 1d according to the second embodiment, the controller 15 does not necessarily need to be disposed on the second principal surface 92 of the mount board 9 and may be disposed on the first principal surface 91 of the mount board 9. The controller 15 may be included in the IC chip 10d.

The circuit configurations of the radio-frequency modules 1, 1a, 1b, 1c, and 1d are not limited to the examples described above. The radio-frequency modules 1, 1a, 1b, 1c, and 1d may be configured to have a radio-frequency front-end circuit that supports multiple-input and multiple-output (MIMO).

(Aspects)

The present specification discloses the following aspects.

A radio-frequency module (1, 1a, 1b, 1c, or 1d) according to a first aspect includes a mount board (9), an antenna terminal (81) and a ground terminal (85), a low-noise amplifier (21), a first inductor (L1), and a second inductor (L2). The mount board (9) has a first principal surface (91) and a second principal surface (92) opposite each other. The antenna terminal (81) and the ground terminal (85) are disposed on the mount board (9). The low-noise amplifier (21) is disposed on the mount board (9). The low-noise amplifier (21) includes a transistor (Tr) for amplification. The first inductor (L1) is disposed on one of the first principal surface (91) and the second principal surface (92) of the mount board (9). The first inductor (L1) is connected to the antenna terminal (81). The second inductor (L2) is disposed on the other of the first principal surface (91) and the second principal surface (92) of the mount board (9). The second inductor (L2) is connected between the transistor (Tr) and the ground terminal (85).

The radio-frequency module (1, 1a, 1b, 1c, or 1d) according to the first aspect can reduce the noise figure of the low-noise amplifier (21).

According to a second aspect, in the radio-frequency module (1, 1a, 1b, 1c, or 1d) according to the first aspect, the antenna terminal (81) and the ground terminal (85) are disposed on the second principal surface (92) of the mount board (9), the first inductor (L1) is disposed on the first principal surface (91) of the mount board (9), and the second inductor (L2) is disposed on the second principal surface (92) of the mount board (9).

According to a third aspect, in the radio-frequency module (1, 1a, 1b, 1c, or 1d) according to the second aspect, the first inductor (L1) does not overlap the second inductor (L2) in plan view in a direction of thickness (D1) of the mount board (9).

The radio-frequency module (1, 1a, 1b, 1c, or 1d) according to the third aspect can suppress magnetic coupling between the first inductor (L1) and the second inductor (L2), and can thus reduce the noise figure of the low-noise amplifier (21).

According to a fourth aspect, the radio-frequency module (1, 1a, 1b, 1c, or 1d) according to the third aspect further includes a reception filter (22) and an input matching circuit (23). The reception filter (22) is connected to the antenna terminal (81), with a matching circuit (3) including the first inductor (L1) interposed therebetween. The input matching circuit (23) is connected between the reception filter (22) and an input terminal of the low-noise amplifier (21). The input matching circuit (23) includes a third inductor (L3) and a fourth inductor (L4). The third inductor (L3) is connected in series to the low-noise amplifier (21). The fourth inductor (L4) is connected between a ground and a node (N1) in a signal path (RS1) between the reception filter (22) and the third inductor (L3). The third inductor (L3) and the fourth inductor (L4) are disposed on the first principal surface (91) of the mount board (9). At least part of the third inductor (L3) overlaps the second inductor (L2) in plan view in the direction of thickness (D1) of the mount board (9).

The radio-frequency module (1, 1a, 1b, 1c, or 1d) according to the fourth aspect facilitates magnetic coupling between the third inductor (L3) and the second inductor (L2), and can thus reduce the noise figure of the low-noise amplifier (21).

According to a fifth aspect, in the radio-frequency module (1, 1a, 1b, 1c, or 1d) according to the fourth aspect, the third inductor (L3) and the fourth inductor (L4) are adjacent in plan view in the direction of thickness (D1) of the mount board (9).

The radio-frequency module (1, 1a, 1b, 1c, or 1d) according to the fifth aspect facilitates magnetic coupling between the third inductor (L3) and the fourth inductor (L4), and can thus reduce the noise figure of the low-noise amplifier (21).

According to a sixth aspect, the radio-frequency module (1, 1a, 1b, 1c, or 1d) according to the fourth or fifth aspect further includes a package (P1) containing the third inductor (L3) and the fourth inductor (L4).

The radio-frequency module (lb) according the sixth aspect stabilizes the magnetic coupling of the third inductor (L3) and the fourth inductor (L4), and can thus reduce variations in the noise figure of the low-noise amplifier (21).

According to a seventh aspect, the radio-frequency module (1, 1a, 1b, 1c, or 1d) according to any one of the second to sixth aspects further includes an IC chip (10) including the low-noise amplifier (21) and the second inductor (L2).

The radio-frequency module (1c) according to the seventh aspect can thus be reduced in size.

According to an eighth aspect, the radio-frequency module (1, 1a, 1b, 1c, or 1d) according to any one of the second to seventh aspects further includes a power amplifier (11). The power amplifier (11) is disposed on the first principal surface (91) of the mount board (9). The power amplifier (11) does not overlap the low-noise amplifier (21) in plan view in a direction of thickness (D1) of the mount board (9).

The radio-frequency module (1d) according to the eighth aspect can thus reduce variations in the noise figure of the low-noise amplifier (21).

A communication device (300 or 300d) according to a ninth aspect includes the radio-frequency module (1, 1a, 1b, lc, or 1d) according to any one of the first to eighth aspects, and a signal processing circuit (301). The signal processing circuit (301) is connected to the radio-frequency module (1, 1a, 1b, 1c, or 1d) and configured to process a radio-frequency signal.

The communication device (300 or 300d) according to the ninth aspect can reduce the noise figure of the low-noise amplifier (21).

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A radio-frequency module comprising:
    a mount board having a first principal surface and a second principal surface on opposite sides of the mount board from one another;
    an antenna terminal and a ground terminal disposed on the mount board;
    a low-noise amplifier disposed on the mount board and including a transistor configured to amplify a signal;
    a first inductor disposed on one of the first principal surface and the second principal surface of the mount board and connected to the antenna terminal; and
    a second inductor disposed on the other of the first principal surface and the second principal surface of the mount board and connected between the transistor and the ground terminal.

2. The radio-frequency module according to claim 1, wherein
    the antenna terminal and the ground terminal are disposed on the second principal surface of the mount board,
    the first inductor is disposed on the first principal surface of the mount board, and
    the second inductor is disposed on the second principal surface of the mount board.

3. The radio-frequency module according to claim 2, wherein a footprint of the first inductor does not overlap a footprint of the second inductor in plan view in a direction of thickness of the mount board.

4. The radio-frequency module according to claim 3, further comprising:
    a reception filter connected to the antenna terminal, with a matching circuit including the first inductor interposed therebetween; and
    an input matching circuit connected between the reception filter and an input terminal of the low-noise amplifier, wherein the input matching circuit includes
    a third inductor connected in series to the low-noise amplifier, and
    a fourth inductor connected between a ground and a node in a signal path between the reception filter and the third inductor,
    the third inductor and the fourth inductor are disposed on the first principal surface of the mount board, and
    at least part of a footprint of the third inductor overlaps the footprint of the second inductor in plan view in the direction of thickness of the mount board.

5. The radio-frequency module according to claim 4, wherein the third inductor and the fourth inductor are adjacent in plan view in the direction of thickness of the mount board.

6. The radio-frequency module according to claim 5, further comprising a package containing the third inductor and the fourth inductor.

7. The radio-frequency module according to claim 6, further comprising an integrated circuit chip including the low-noise amplifier and the second inductor.

8. The radio-frequency module according to claim 5, further comprising an integrated circuit chip including the low-noise amplifier and the second inductor.

9. The radio-frequency module according to claim 5, further comprising:
    a power amplifier disposed on the first principal surface of the mount board,
    wherein a footprint of the power amplifier does not overlap a footprint of the low-noise amplifier in plan view in a direction of thickness of the mount board.

10. The radio-frequency module according to claim 4, further comprising a package containing the third inductor and the fourth inductor.

11. The radio-frequency module according to claim 10, further comprising an integrated circuit chip including the low-noise amplifier and the second inductor.

12. The radio-frequency module according to claim 4, further comprising an integrated circuit chip including the low-noise amplifier and the second inductor.

13. The radio-frequency module according to claim 4, further comprising:
    a power amplifier disposed on the first principal surface of the mount board,
    wherein a footprint of the power amplifier does not overlap a footprint of the low-noise amplifier in plan view in a direction of thickness of the mount board.

14. The radio-frequency module according to claim 3, further comprising an integrated circuit chip including the low-noise amplifier and the second inductor.

15. The radio-frequency module according to claim 3, further comprising:
    a power amplifier disposed on the first principal surface of the mount board,
    wherein a footprint of the power amplifier does not overlap a footprint of the low-noise amplifier in plan view in a direction of thickness of the mount board.

16. The radio-frequency module according to claim 2, further comprising an integrated circuit chip including the low-noise amplifier and the second inductor.

17. The radio-frequency module according to claim 2, further comprising:
- a power amplifier disposed on the first principal surface of the mount board,
- wherein a footprint of the power amplifier does not overlap a footprint of the low-noise amplifier in plan view in a direction of thickness of the mount board.

18. The radio-frequency module according to claim 1, further comprising an integrated circuit chip including the low-noise amplifier and the second inductor.

19. The radio-frequency module according to claim 1, further comprising:
- a power amplifier disposed on the first principal surface of the mount board,
- wherein a footprint of the power amplifier does not overlap a footprint of the low-noise amplifier in plan view in a direction of thickness of the mount board.

20. A communication device comprising:
- a radio-frequency module; and
- a signal processing circuit connected to the radio-frequency module and configured to process a radio-frequency signal, wherein the radio-frequency module includes
- a mount board having a first principal surface and a second principal surface on opposite sides of the mount board from one another,
- an antenna terminal and a ground terminal disposed on the mount board,
- a low-noise amplifier disposed on the mount board and including a transistor configured to amplify a signal,
- a first inductor disposed on one of the first principal surface and the second principal surface of the mount board and connected to the antenna terminal, and
- a second inductor disposed on the other of the first principal surface and the second principal surface of the mount board and connected between the transistor and the ground terminal.

* * * * *